US007009874B2

(12) United States Patent
Deak

(10) Patent No.: US 7,009,874 B2
(45) Date of Patent: Mar. 7, 2006

(54) LOW REMANENCE FLUX CONCENTRATOR FOR MRAM DEVICES

(75) Inventor: James G. Deak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/932,949

(22) Filed: Sep. 2, 2004

(65) Prior Publication Data

US 2005/0030786 A1 Feb. 10, 2005

Related U.S. Application Data

(60) Continuation of application No. 10/785,769, filed on Feb. 24, 2004, now Pat. No. 6,833,278, which is a division of application No. 10/137,500, filed on May 2, 2002, now Pat. No. 6,724,652.

(51) Int. Cl.
*G11C 11/15* (2006.01)
*H01L 23/48* (2006.01)

(52) U.S. Cl. .................. 365/158; 365/171; 257/421; 257/422

(58) Field of Classification Search ............... 365/158, 365/171, 173; 257/421, 422
See application file for complete search history.

(56) References Cited

U.S. PATENT DOCUMENTS

| 4,780,848 A | 10/1988 | Daughton et al. ........... 365/173 |
| 5,587,943 A | 12/1996 | Torok et al. ................. 365/158 |
| 5,640,343 A | 6/1997 | Gallagher et al. ........... 365/171 |
| 5,659,499 A | 8/1997 | Chen et al. .................. 365/158 |
| 5,748,524 A | 5/1998 | Chen et al. .................. 365/173 |

(Continued)

OTHER PUBLICATIONS

Cardoso, S., et al., "Spin–tunnel–junction thermal stability and interface interdiffusion above 300 °", *Applied Physics Letters*, 76(5), (Jan. 31, 2000), 610–612.

Gillies, M. F. et al., "Effect of thin oxide layers incorporated in spin valve structures", *Journal of Applied Physics*, 89(11), (Jun. 1, 2001), 6922–6924.

Gillies, M. F., "Enhancement of the giant magnetorsistance in spin valves via oxides formed from magnetics layers", *Journal of Applied Physics*, 88(10), (Nov. 15, 2000), 5894–5898.

Lai, Chih–Haung, et al., "Giant magnetorsistance enhancement in spin valves with nano–oxide layers", *Journal of Applied Physics*, 89(11),(Jun. 1, 2001), 6928–6930.

Roos, B. F., et al., "Auger electron spectroscopic studies of anneling effects at Fe/FeOx/Al and Co/CoOx/Al interfaces", *Surface Science*, 497(1–3),(Jan. 20, 2002), L55–L59.

Sant, S., et al., "Giant magnetoresistance in ion beam deposited spin–valve films with specular enhancement", *Journal of Applied Physics*, 89(11),(Jun. 1, 2001), 6931–6933.

(Continued)

*Primary Examiner*—Son Mai
(74) *Attorney, Agent, or Firm*—Schwegman, Lundberg, Woessner & Kluth, P.A.

(57) ABSTRACT

Systems, devices and methods are provided for magnetic memory elements with low remanence flux concentrators. Improved bit yield is attributable to reduced remanence in the flux concentrator. Remanence provides the memory element with a biasing magnetic field. The flux concentrator includes anisotropy aligned with an appropriate conductor. One aspect of the present subject matter is a memory cell. One memory cell embodiment includes a magnetic memory element and a flux concentrator operably positioned with respect to a conductor. The conductor is adapted to provide a current-induced magnetic flux to the magnetic memory element. The flux concentrator includes an easy axis of magnetization aligned with the conductor and a hard axis of magnetization orthogonal to the easy axis of magnetization. Other aspects are provided herein.

39 Claims, 16 Drawing Sheets

U.S. PATENT DOCUMENTS

| | | | |
|---|---|---|---|
| 5,793,697 | A | 8/1998 | Scheuerlein ............ 365/230.07 |
| 5,861,328 | A | 1/1999 | Tehrani et al. ............... 438/210 |
| 5,956,267 | A | 9/1999 | Hurst et al. .................. 365/158 |
| 5,966,323 | A | 10/1999 | Chen et al. .................. 365/158 |
| 5,986,858 | A | 11/1999 | Sato et al. ................... 360/113 |
| 6,005,800 | A | 12/1999 | Koch .......................... 428/692 |
| 6,034,887 | A | 3/2000 | Gupta et al. ................. 365/171 |
| 6,081,446 | A | 6/2000 | Brug et al. .................. 365/171 |
| 6,097,625 | A | 8/2000 | Scheuerlein et al. ......... 365/171 |
| 6,097,626 | A | 8/2000 | Brug et al. .................. 365/171 |
| 6,104,633 | A | 8/2000 | Abraham et al. ............ 365/171 |
| 6,134,139 | A | 10/2000 | Bhattacharyya et al. .... 365/171 |
| 6,166,948 | A | 12/2000 | Parkin et al. ................ 365/173 |
| 6,172,904 | B1 | 1/2001 | Anthony et al. ............. 365/173 |
| 6,174,737 | B1 | 1/2001 | Durlam et al. .................. 438/3 |
| 6,191,972 | B1 | 2/2001 | Miura et al. ................. 365/171 |
| 6,191,973 | B1 | 2/2001 | Moyer ......................... 365/173 |
| 6,211,090 | B1 | 4/2001 | Durlam et al. .............. 438/692 |
| 6,211,559 | B1 | 4/2001 | Zhu et al. .................... 257/421 |
| 6,219,212 | B1 | 4/2001 | Gill et al. ................. 360/324.2 |
| 6,219,275 | B1 | 4/2001 | Nishimura ................... 365/173 |
| 6,226,160 | B1 | 5/2001 | Gallagher et al. ........ 360/324.2 |
| 6,233,172 | B1 | 5/2001 | Chen et al. .................. 365/173 |
| 6,242,770 | B1 | 6/2001 | Bronner et al. ............. 257/295 |
| 6,256,223 | B1 | 7/2001 | Sun et al. .................... 365/171 |
| 6,256,247 | B1 | 7/2001 | Perner ......................... 365/209 |
| 6,259,586 | B1 | 7/2001 | Gill ......................... 360/324.2 |
| 6,269,018 | B1 | 7/2001 | Monsma et al. ............. 365/145 |
| 6,326,637 | B1 * | 12/2001 | Parkin et al. |
| 6,358,757 | B1 | 3/2002 | Anthony ......................... 438/3 |
| 6,392,922 | B1 * | 5/2002 | Liu et al. |
| 6,430,084 | B1 | 8/2002 | Rizzo et al. ................. 365/173 |
| 6,430,085 | B1 | 8/2002 | Rizzo .......................... 365/173 |
| 6,510,080 | B1 | 1/2003 | Farrar ......................... 365/171 |
| 6,525,957 | B1 | 2/2003 | Goronkin et al. ........... 365/158 |
| 6,538,917 | B1 | 3/2003 | Tran et al. ................... 365/158 |
| 6,570,783 | B1 * | 5/2003 | Deak |
| 6,623,987 | B1 * | 9/2003 | Liu et al. |
| 6,627,932 | B1 * | 9/2003 | Drewes |
| 6,656,371 | B1 * | 12/2003 | Drewes |
| 6,677,631 | B1 * | 1/2004 | Drewes |
| 6,683,806 | B1 * | 1/2004 | Drewes |
| 6,689,622 | B1 * | 2/2004 | Drewes |
| 6,707,084 | B1 * | 3/2004 | Katti et al. |
| 6,716,644 | B1 * | 4/2004 | Nejad et al. |
| 6,724,652 | B1 * | 4/2004 | Deak |
| 6,728,132 | B1 * | 4/2004 | Deak |
| 6,740,947 | B1 | 5/2004 | Bhattacharyya et al. .... 257/421 |
| 6,743,641 | B1 * | 6/2004 | Yates et al. |
| 6,765,823 | B1 * | 7/2004 | Zhu et al. |
| 6,771,533 | B1 * | 8/2004 | Witcraft et al. |
| 6,780,653 | B1 | 8/2004 | Nejad et al. |
| 6,780,654 | B1 | 8/2004 | Nejad et al. |
| 6,781,173 | B1 | 8/2004 | Tuttle et al. |
| 6,781,174 | B1 | 8/2004 | Nejad et al. |
| 6,806,546 | B1 | 10/2004 | Liu et al. |
| 6,807,087 | B1 | 10/2004 | Deak |
| 6,816,402 | B1 | 11/2004 | Deak |
| 6,828,639 | B1 | 12/2004 | Nejad et al. |
| 6,833,278 | B1 | 12/2004 | Deak |
| 6,845,036 | B1 | 1/2005 | Witcraft et al. |
| 6,849,464 | B1 | 2/2005 | Drewes |
| 6,852,550 | B1 | 2/2005 | Tuttle et al. |
| 6,870,714 | B1 | 3/2005 | Drewes |
| 6,870,759 | B1 * | 3/2005 | Tsang ......................... 365/158 |
| 6,881,993 | B1 | 4/2005 | Drewes et al. |
| 6,885,073 | B1 | 4/2005 | Drewes |
| 6,885,576 | B1 | 4/2005 | Deak |
| 6,900,455 | B1 | 5/2005 | Drewes |
| 6,900,489 | B1 | 5/2005 | Drewes |
| 6,902,940 | B1 | 6/2005 | Drewes |
| 6,903,399 | B1 | 6/2005 | Katti et al. |
| 6,906,396 | B1 | 6/2005 | Tuttle et al. |
| 6,906,950 | B1 | 6/2005 | Zhu et al. |
| 2001/0025978 | A1 | 10/2001 | Nakao ......................... 257/314 |
| 2001/0036675 | A1 | 11/2001 | Anthony ......................... 438/3 |
| 2001/0036699 | A1 | 11/2001 | Slaughter .................... 438/240 |
| 2002/0007454 | A1 | 1/2002 | Covington |
| 2002/0044396 | A1 | 4/2002 | Qmano et al. |
| 2002/0080645 | A1 | 6/2002 | Liu |
| 2002/0085412 | A1 | 7/2002 | Liu et al. |
| 2003/0024465 | A1 | 2/2003 | Perner et al. |
| 2003/0059958 | A1 | 3/2003 | Drewes |
| 2003/0090932 | A1 | 5/2003 | Deak |
| 2003/0119210 | A1 | 6/2003 | Yates et al. |
| 2003/0132494 | A1 | 7/2003 | Tuttle et al. |
| 2003/0146459 | A1 | 8/2003 | Katti et al. |
| 2003/0161079 | A1 | 8/2003 | Takahashi et al. |
| 2003/0185045 | A1 | 10/2003 | Drewes |
| 2003/0189842 | A1 | 10/2003 | Deak |
| 2003/0194819 | A1 | 10/2003 | Drewes |
| 2003/0207486 | A1 | 11/2003 | Deak |
| 2003/0216032 | A1 | 11/2003 | Nejad et al. |
| 2003/0228710 | A1 | 12/2003 | Drewes |
| 2003/0228711 | A1 | 12/2003 | Nejad |
| 2003/0228713 | A1 | 12/2003 | Nejad |
| 2003/0228726 | A1 | 12/2003 | Nejad |
| 2003/0235068 | A1 | 12/2003 | Deak |
| 2004/0012056 | A1 | 1/2004 | Nejad |
| 2004/0012895 | A1 | 1/2004 | Drewes et al. |
| 2004/0014243 | A1 | 1/2004 | Drewes |
| 2004/0017639 | A1 | 1/2004 | Deak |
| 2004/0018645 | A1 | 1/2004 | Drewes |
| 2004/0027844 | A1 | 2/2004 | Nejad et al. |
| 2004/0032765 | A1 | 2/2004 | Deak |
| 2004/0041182 | A1 | 3/2004 | Tuttle et al. |
| 2004/0041184 | A1 | 3/2004 | Tuttle et al. |
| 2004/0042128 | A1 | 3/2004 | Slaughter et al. |
| 2004/0042246 | A1 | 3/2004 | Drewes et al. |
| 2004/0042258 | A1 | 3/2004 | Witcraft |
| 2004/0042260 | A1 | 3/2004 | Deak |
| 2004/0042315 | A1 | 3/2004 | Drewes |
| 2004/0052150 | A1 | 3/2004 | Drewes |
| 2004/0061154 | A1 | 4/2004 | Huai et al. |
| 2004/0062081 | A1 | 4/2004 | Drewes |
| 2004/0066667 | A1 | 4/2004 | Deak |
| 2004/0091634 | A1 | 5/2004 | Liu et al. |
| 2004/0119095 | A1 * | 6/2004 | Tuttle et al. |
| 2004/0124485 | A1 * | 7/2004 | Yates et al. |
| 2004/0145943 | A1 * | 7/2004 | Zhu et al. |
| 2004/0150059 | A1 * | 8/2004 | Drewes |
| 2004/0152265 | A1 * | 8/2004 | Nejad et al. |
| 2004/0155218 | A1 * | 8/2004 | Deak |
| 2004/0160810 | A1 * | 8/2004 | Deak et al. |
| 2004/0166618 | A1 * | 8/2004 | Deak |
| 2004/0180237 | A1 * | 9/2004 | Drewes |
| 2004/0183099 | A1 * | 9/2004 | Katti et al. |
| 2004/0195639 | A1 * | 10/2004 | Drewes |
| 2004/0201070 | A1 * | 10/2004 | Deak |
| 2004/0202018 | A1 * | 10/2004 | Witcraft et al. |
| 2004/0217399 | A1 * | 11/2004 | Drewes |
| 2004/0217403 | A1 * | 11/2004 | Drewes |
| 2004/0227244 | A1 * | 11/2004 | Liu et al. |
| 2004/0234815 | A1 * | 11/2004 | Drewes |
| 2004/0240264 | A1 * | 12/2004 | Zhu et al. |
| 2005/0003561 | A1 * | 1/2005 | Drewes |
| 2005/0040453 | A1 * | 2/2005 | Nejad et al. |

| | | | |
|---|---|---|---|
| 2005/0041463 A1 | * | 2/2005 | Drewes |
| 2005/0047263 A1 | * | 3/2005 | Drewes et al. |
| 2005/0078512 A1 | * | 4/2005 | Deak |
| 2005/0079638 A1 | * | 4/2005 | Drewes et al. |
| 2005/0099844 A1 | * | 5/2005 | Witcraft et al. |
| 2005/0122773 A1 | * | 6/2005 | Deak |
| 2005/0146912 A1 | * | 7/2005 | Deak |

OTHER PUBLICATIONS

Veloso, A., et al., "Magnetoresistance enhancement in specular, bottom-pinned, Mn 83Ir17 spin valves with nano-oxide layers", *Applied Physics Letters, 77(7),* (Aug. 14, 2000), 1020–1022.

* cited by examiner

LOW REMANENCE FLUX CONCENTRATOR FOR MRAM DEVICES

RELATED APPLICATION(S)

This application is a Continuation of U.S. Ser. No. 10/785,769 filed Feb. 24, 2004, now U.S. Pat. No. 6,833,278 which is a Divisional of U.S. application Ser. No. 10/137,500 filed May 2, 2002, now U.S. Pat. No. 6,724,652. These applications are incorporated herein by reference.

TECHNICAL FIELD OF THE INVENTION

This invention relates generally to integrated circuits and, more particularly, to nonvolatile memory arrays that use magnetic memory elements with flux concentrators.

BACKGROUND OF THE INVENTION

During the 1950s and 1960s, magnetic core memories were the predominant storage technology for the working memory of computing systems. The magnetic core memory technology was costly. In the 1970s, magnetic core memories were replaced with integrated circuits, including static random access memory (SRAM) and including dynamic random access memory (DRAM). Non-volatile memories, such as FLASH memory for example, have been developed to address the problem of data volatility. Because of the rapid advancement in semiconductor density coupled with the advent of the DRAM cell, magnetic storage technology was not used for high-speed on-line memory, but rather was left to be used for low-cost, high-density memory in the form of various disk drive technologies.

The semiconductor industry continuously strives to reduce the size and cost of memory, increase the speed for accessing memory, and improve the reliability of memory. One particular problem confronting the semiconductor industry is that of reducing the size of the memory cell in a Random Access Memory (RAM).

Magnetic storage such as Magnetic Random Access Memory (MRAM) technology has been proposed as a replacement or supplement to the DRAM. In the MRAM structures that are being proposed, the capacitor storage element of the DRAM cell is replaced by a magnetic element that has a magnetic moment and is characterized by a predominant or easy axis of magnetization. In the absence of an external magnetic field, the magnetic moment is oriented along the easy axis of magnetization in one of two stable states. In magnetoresistance technology, one of the stable states for the magnetic moment of the magnetic element is a high resistance state and the other of the stable states is a low resistance state.

A flux concentrator is a material that has a high permeability and that is magnetically soft. Flux concentrators concentrate magnetic flux into a desired area, and have been used in MRAM structures to minimize the current required to set the magnetization of the memory element. One example of a flux concentrator is high permeability cladding material which has been incorporated on the outside faces of conductors to focus the magnetic flux toward the magnetic element and to provide shielding from stray electric fields.

Although flux concentrators minimize the current required to set the magnetization of the memory element, they have a non-zero remanence. One definition of remanence is the magnetic inductance remaining in a magnetized substance that is no longer under external magnetic influence. Thus, flux concentrators are capable of magnetically biasing the magnetic elements in the MRAM. The magnetic biasing effect of the remanence is capable of significantly changing the amount of current required to write to the bit because the magnetic induction attributable to the remanence is summed to the current-induced magnetic flux.

Less current is required to change the stable state of the magnetic moment when the biasing effect of remanence is parallel to the current-induced magnetic flux and antiparallel to the magnetic moment of the cell such that half-select errors are capable of being more problematic. A half-select error occurs when the current in one of the lines (bit or word lines) is sufficient to write data to the memory element. That is, when a selected memory element is written, a half-select error causes other memory element(s) in the same row and/or the same column to be unintentionally written.

More current is required to produce a sufficiently large magnetic field to overcome the biasing effect of remanence when the biasing effect is antiparallel, or opposing, to the current-induced magnetic flux and parallel to the magnetic moment of the cell. If the biasing effect of remanence is too strong, the selected memory storage element is not able to be written.

Therefore, there is a need in the art to overcome the problems attributable to remanence in flux concentrators in magnetic memory elements.

SUMMARY OF THE INVENTION

The above mentioned problems are addressed by the present subject matter and will be understood by reading and studying the following specification. The present subject matter provides magnetic memory elements with low remanence flux concentrators. Flux concentrators concentrate magnetic flux into a desired area, and minimize the current required to set the magnetization of the memory element. The flux concentrator is provided with a large anisotropy to provide the flux concentrator with an easy axis of magnetization that is generally aligned with the conductor and a hard axis of magnetization that is generally orthogonal to the easy axis of magnetization. When a current-induced magnetic field is removed, the magnetization of the flux concentrator realigns with the easy axis of magnetization. As such, remanence, along with the associated biasing magnetic field to the memory element, is reduced.

One aspect of the present subject matter is a memory cell. One memory cell embodiment includes a magnetic memory element and a flux concentrator operably positioned with respect to a conductor. The conductor is adapted to provide a current-induced magnetic flux to the magnetic memory element. The flux concentrator includes an easy axis of magnetization aligned with the conductor and a hard axis of magnetization orthogonal to the easy axis of magnetization.

One aspect provides a method of writing to a magnetic storage device. According to one embodiment, a first conductor is energized to provide a first current-induced magnetic field through a first flux concentrator in a hard axis of magnetization direction. The first current-induced magnetic field is provided to the magnetic storage device. A second conductor is energized to provide a second current-induced magnetic field through a second flux concentrator in a hard axis of magnetization direction. The second current-induced magnetic field is provided to the magnetic storage device. The combination of the first current-induced magnetic field and the second current-induced magnetic field is sufficient to move a magnetic moment of the magnetic storage device from a first stable state to a second stable state. When the current-induced magnetic field is removed, the magnetization of the first and second flux concentrators realigns with their easy axis of magnetization.

One aspect provides a method of forming a memory array. According to one embodiment, at least one first flux concentrator is formed with an easy axis of magnetization. At least one first conductor is formed to be operably positioned with respect to the first flux concentrator and aligned with the easy axis of magnetization. At least one magnetic memory element is formed to be operably positioned with respect to the first flux concentrator and the first conductor so as to receive a first current-induced magnetic field. At least one second conductor is formed to be operably positioned with respect to the magnetic memory element so as to provide the magnetic memory element with a second current-induced magnetic field from the second conductor. The second current-induced magnetic field is relatively orthogonal to the first current-induced magnetic field. At least one second flux concentrator is formed to be operably positioned with respect to the second conductor. The second flux concentrator is formed with an easy axis of magnetization aligned with the second conductor.

These and other aspects, embodiments, advantages, and features will become apparent from the following description of the invention and the referenced drawings.

DETAILED DESCRIPTION OF THE INVENTION

Figure 1:
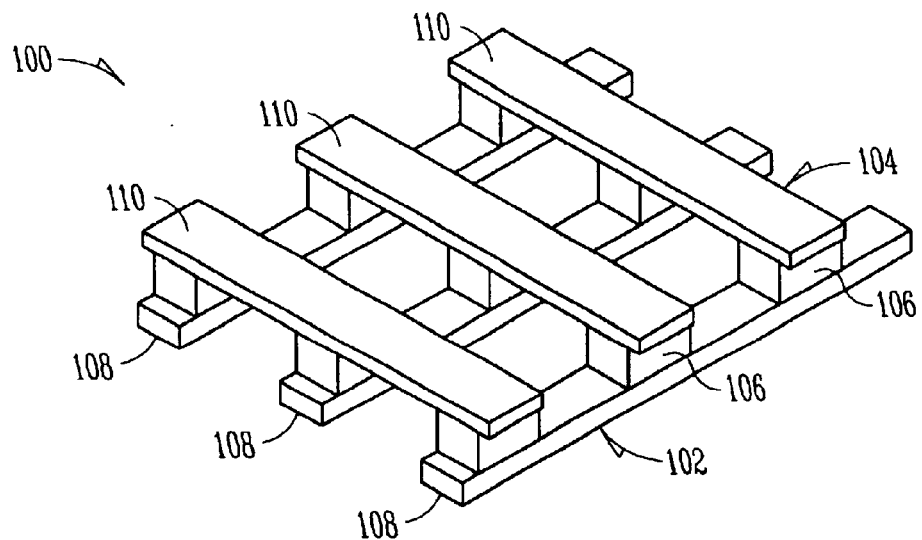
FIG. 1 is an illustration of a conventional cross point array for a conventional MRAM.

The following detailed description of the invention refers to the accompanying drawings which show, by way of illustration, specific aspects and embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

The present subject matter provides magnetic memory elements with low remanence flux concentrators. The flux concentrator is provided with a large anisotropy to provide the flux concentrator with an easy axis of magnetization that is generally aligned with the conductor and a hard axis of magnetization that is generally orthogonal to the easy axis of magnetization.

MRAM Overview

FIG. 1 is an illustration of a conventional cross point array for a conventional MRAM. The cross point array 100 includes a first wiring layer 102, a second wiring layer 104, and magnetic storage elements 106 stored between the first wiring layer 102 and second wiring layer 104. The plane of the second wiring layer 104 is approximately parallel 102 to the plane of the first wiring layer 102. The illustrated first wiring layer 102 includes a plurality of parallel or approximately parallel word lines 108. The second wiring layer 104 includes a plurality of parallel or approximately parallel bit lines 110. The bit lines 110 are orthogonal or approximately orthogonal, albeit in a different plane, to the word lines 108, as is evident in the illustration of FIG. 2.

Figure 2:
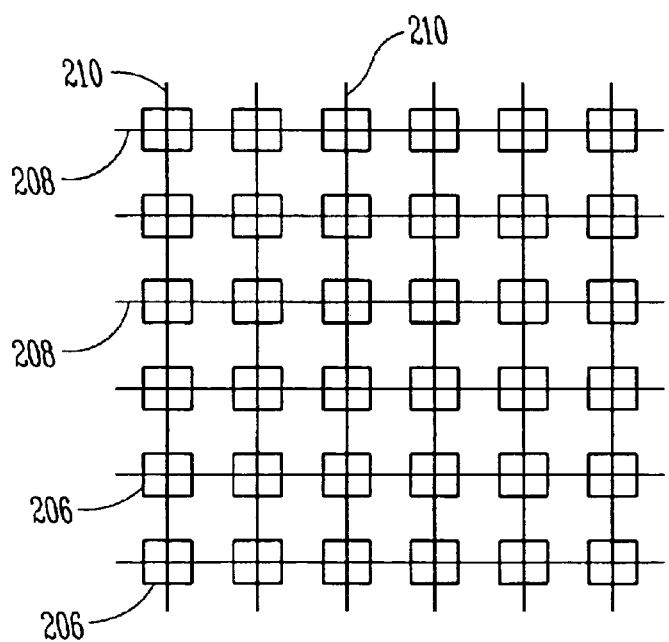
FIG. 2 is a top view of the cross point array of FIG. 1.

FIG. 2 is a top view of the cross point array of FIG. 1. The parallel word lines 208 and the parallel bit lines 210 are orthogonal to each other and cross at intersections in the cross point array. A magnetic storage element 206 is positioned at each intersection, and is selected using the corresponding word line 208 and bit line 210.

Figure 3:
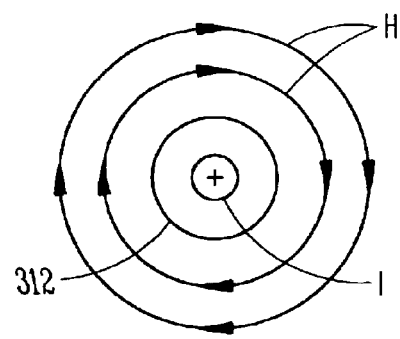
FIG. 3 is an illustration of the magnetic field around a conductor resulting from current flowing into the page.

FIGS. 3–6 illustrate the relationship between the current and magnetic field, and further introduces conventional symbols used to represent this relationship. FIG. 3 is an illustration of the magnetic field around a cross-section of a conductor 312 resulting from current flowing into the page. The direction of the current is represented by the symbol ⊕, which conventionally represents the tail of an arrow pointing into the page. The magnetic field lines, conventionally represented by the nomenclature H, form concentric lines around the conductor or wire 312. The magnitude of H is stronger closer to the conductor 312. The direction for the lines of H is obtained by the Right Hand Rule, which provides that if the conductor 312 is grabbed with the right hand with the thumb pointing in the direction of the current, the fingers will curl around the conductor in the direction of H. In the illustration of FIG. 3 in which the current is flowing into the page, the direction for the lines of H is clockwise around the conductor 312.

Figure 4:
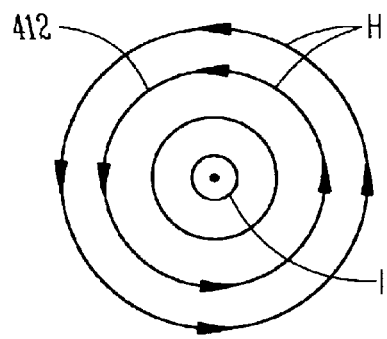
FIG. 4 is an illustration of the magnetic field around a conductor resulting from current flowing out from the page.

FIG. 4 is an illustration of the magnetic field around a cross-section of a conductor resulting from current flowing out from the page. The direction of the current is represented by the symbol ⊙, which conventionally represents the point or head of the arrow pointing out of the page. The magnetic field lines H form concentric lines around the conductor 412. The direction for the lines of H is obtained by the Right Hand Rule. In the illustration of FIG. 4 in which the current is flowing out of the page, the direction for the lines of H is counterclockwise around the conductor 412.

Figure 5:
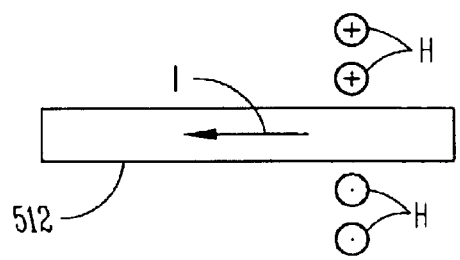
FIG. 5 is an illustration of the magnetic field around a conductor resulting from current flowing left.

FIG. 5 is an illustration of the magnetic field around a conductor resulting from current flowing left along the conductor. Again the magnetic field lines H form concentric lines around the conductor 512. A cross section of the lines of H is represented by the symbols ⊕ and ⊙, wherein the symbol ⊕ indicates that H is directed into the page, and the symbol ⊙ indicates that H is directed out of the page. In the illustration of FIG. 5 in which the current is flowing left, the direction for the lines of H is into the page above the conductor 512 and out of the page below the conductor 512.

Figure 6:
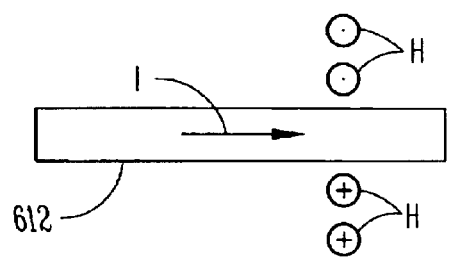
FIG. 6 is an illustration of the magnetic field around a conductor resulting from current flowing right.

FIG. 6 is an illustration of the magnetic field around a conductor resulting from current flowing right. When the current is flowing right, the direction for the lines of H is into the page below the conductor 612 and out of the page above the conductor 612.

Figure 7:
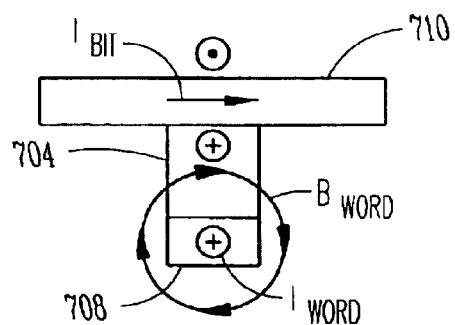
FIG. 7 is a side view of a memory cell in the conventional cross point array of FIG. 1, and illustrates the magnetic flux density associated with a bit line current ($I_{BIT}$) flowing right and a word line current ($I_{WORD}$) flowing into the page.

FIG. 7 is a side view of a memory cell in the conventional cross point array of FIG. 1, and illustrates the magnetic flux density associated with a bit line current ($I_{BIT}$) flowing right and a word line current ($I_{WORD}$) flowing into the page. A bit line 710, a word line 708 and a magnetic storage element 704 are shown. The magnetic element has a magnetic moment and is characterized by a predominant or easy axis of magnetization. In the absence of an external magnetic field, the magnetic moment is oriented along the easy axis of magnetization in one of two stable states. In magnetoresistance technology, one of the stable states for the magnetic moment of the magnetic element is a high resistance state and the other of the stable states is a low resistance state.

It is noted that magnetic flux density B is related to magnetic field strength H by the equation $B=\mu H$, where $\mu$ is the permeability of the solid. The magnetic flux density resulting from the bit line current $I_{BIT}$ is represented by the nomenclature $B_{BIT}$, and the magnetic flux density resulting from word line current $I_{WORD}$ is represented by the nomenclature $B_{WORD}$. At the magnetic storage element 704, the lines of $B_{WORD}$ are directed toward the right and the lines of $B_{BIT}$ are directed into the page.

Figure 8:
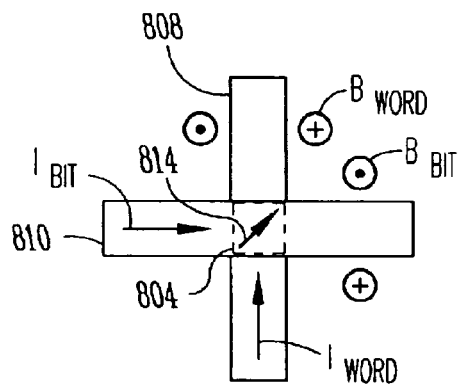
FIG. 8 is a top view of the memory cell of FIG. 7.

FIG. 8 is a top view of the memory cell of FIG. 7. The lines of $B_{BIT}$ at the magnetic storage element 804, which is illustrated below the bit line conductor 810, are directed toward the top of the page, and the lines of $B_{WORD}$ at the magnetic storage element 804, which is illustrated above the word line conductor 808, are directed toward the right. The resultant magnetic flux density vector provided by the vector sum of $B_{BIT}$ and $B_{WORD}$ is oriented in the direction provided by the arrow at 814.

Figure 9:
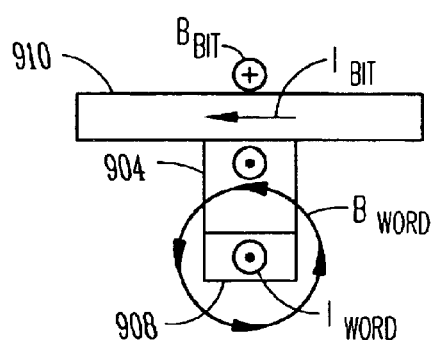
FIG. 9 is a side view of a memory cell in the conventional cross point array of FIG. 1, and illustrates the magnetic fields associated with a bit line current ($I_{BIT}$) flowing left and a word line current ($I_{WORD}$) flowing out from the page.

FIG. 9 is a side view of a memory cell in the conventional cross point array of FIG. 1, and illustrates the magnetic fields associated with a bit line current ($I_{BIT}$) flowing left and a word line current ($I_{WORD}$) flowing out from the page. A bit line 910, a word line 908 and a magnetic storage element 904 are shown. At the magnetic storage element 904, the lines of $B_{WORD}$ are directed toward the left and the lines of $B_{BIT}$ are directed out of the page.

Figure 10:
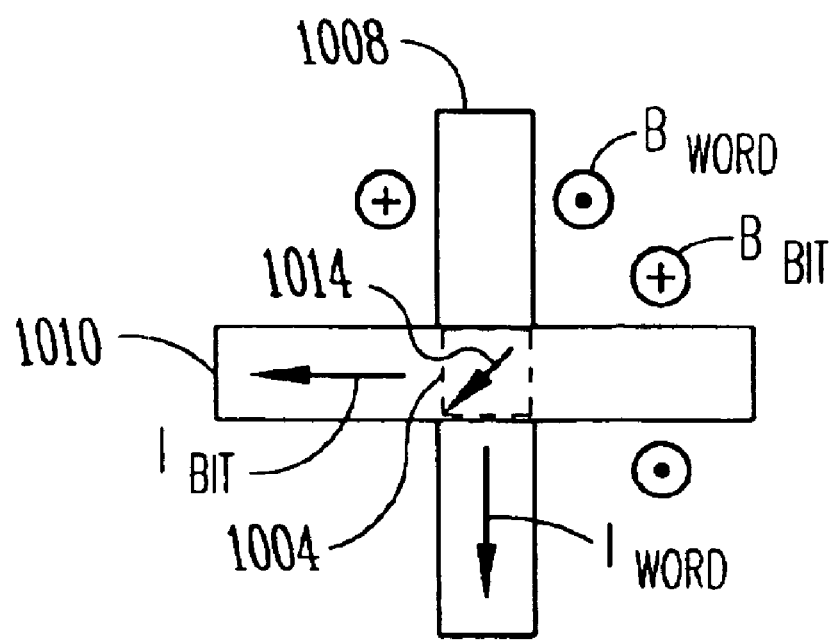
FIG. 10 is a top view of the memory cell of FIG. 9.

FIG. 10 is a top view of the memory cell of FIG. 9. The lines of $B_{BIT}$ at the magnetic storage element 1004, which is illustrated below the bit line conductor 1010, are directed toward the bottom of the page, and the lines of $B_{WORD}$ at the magnetic storage element 1004, which is illustrate above the word line conductor 1008, are directed toward the left. The resultant magnetic field vector provided by the vector sum of $B_{BIT}$ and $B_{WORD}$ is oriented in the direction provided by the arrow at 1014.

Flux Concentrator

It is noted that magnetic flux density B is related to magnetic field strength H by the equation $B=\mu H$, where $\mu$ is the permeability of the solid. Thus, the flux density B is higher in materials with higher permeability $\mu$. Flux concentrators are formed from a highly permeable ferromagnetic material to enhance the magnetic flux density around the magnetic storage element. A flux concentrator is a material that has a high permeability and that is magnetically soft. Flux concentrators concentrate magnetic flux into a desired area, and have been used in MRAM structures to minimize the current required to set the magnetization of the memory element.

Figure 11:
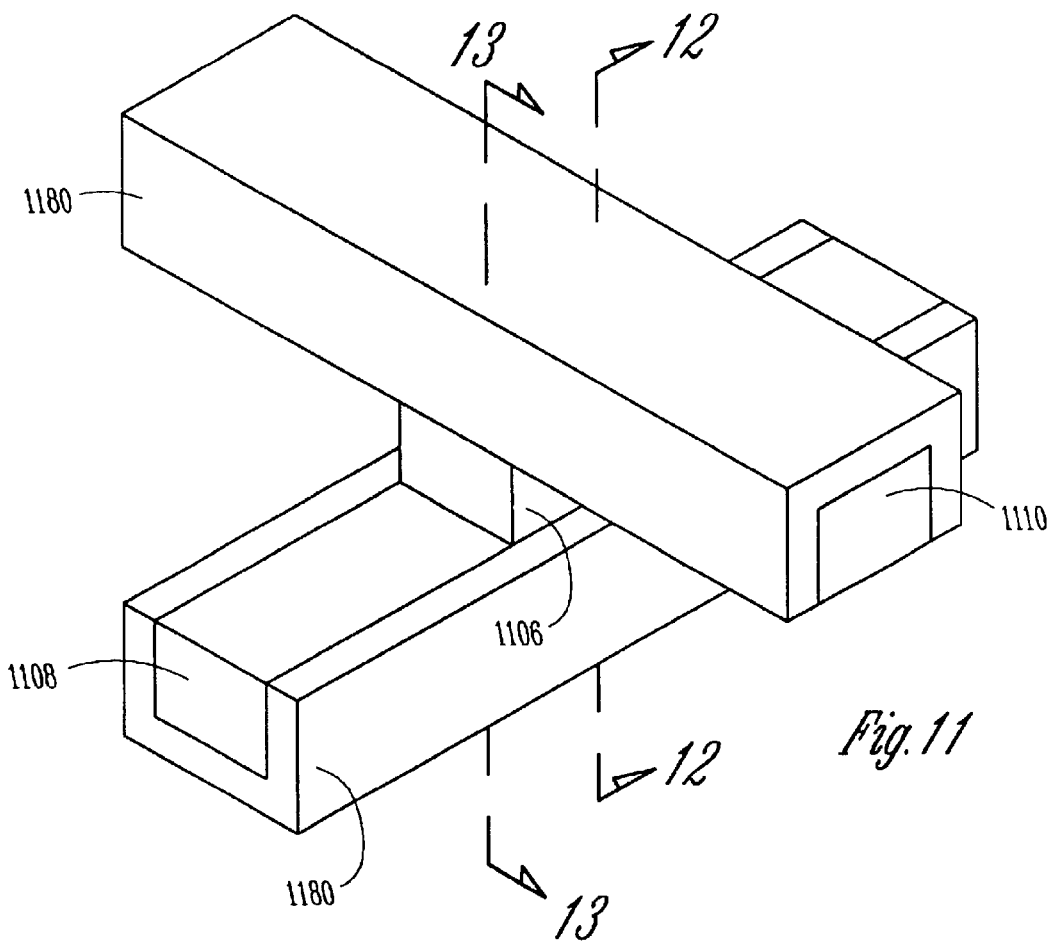
FIG. 11 is an illustration of one embodiment of a bit line and word line cross point, wherein both the bit line and the word line incorporate cladding material with a high permeability.
Figure 12:
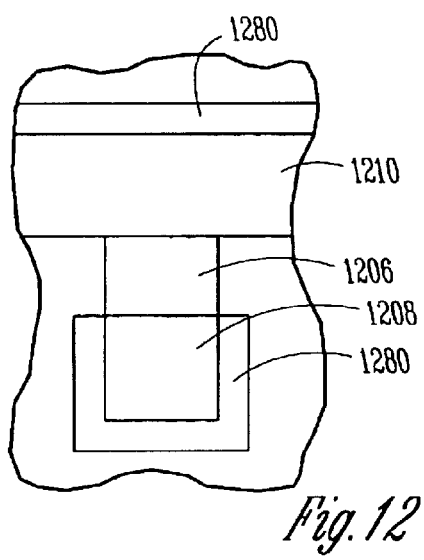
FIG. 12 is a cross sectional view taken along line 12—12 in FIG. 11.
Figure 13:
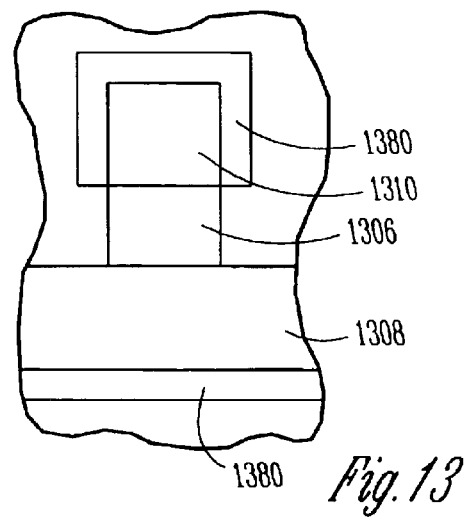
FIG. 13 is a cross sectional view taken along line 13—13 in FIG. 11.

FIGS. 11–13 illustrate high permeability cladding material as one example of a flux concentrator. The cladding material has been incorporated on the outside faces of conductors to focus the magnetic flux toward the magnetic storage element.

FIG. 11 is an illustration of one embodiment of a bit line and word line cross point, wherein both the bit line and the word line incorporate cladding material with a high permeability. A magnetic storage element 1106 is interposed between a word line 1108 and a bit line 1110. The structure includes a cladding material 1180 that has a high permeability. The cladding material 1180 functions as a flux concentrator. The illustrated embodiment shows the cladding material 1180 surrounding various sides of the conductors 1108 and 1110. The invention is not limited to this particular arrangement, however, as one of ordinary skill in the art will understand, upon reading and comprehending this disclosure, that other types and arrangements of flux concentrators are capable of being incorporated in the design of the memory structure. The cladding material 1180 focuses the magnetic flux toward the magnetic storage 1106 element.

FIG. 12 is a cross sectional view taken along line 12—12 in FIG. 11. FIG. 13 is a cross sectional view taken along line 13—13 in FIG. 11. These figures further illustrate the cladding material 1280 and 1380 formed along the outside faces of the word conductor 1208 and 1308 and the bit conductor 1210 and 1310 so as to enhance the magnetic flux through the magnetic storage element 1206 and 1306. Less current is required to write to the magnetic storage element because of the enhanced magnetic flux.

Remanence Of Flux Concentrators

One of ordinary skill in the art will understand the concept of remanence. For the convenience of the reader, the concept of remanence is developed below with respect to FIGS. 14–19 by evaluating the domain structure of ferromagnetic material as provided by James F. Shackelford, *Introduction to Materials Science For Engineers*, Second Edition, Macmillan Publishing Company, 1988.

Figure 14:
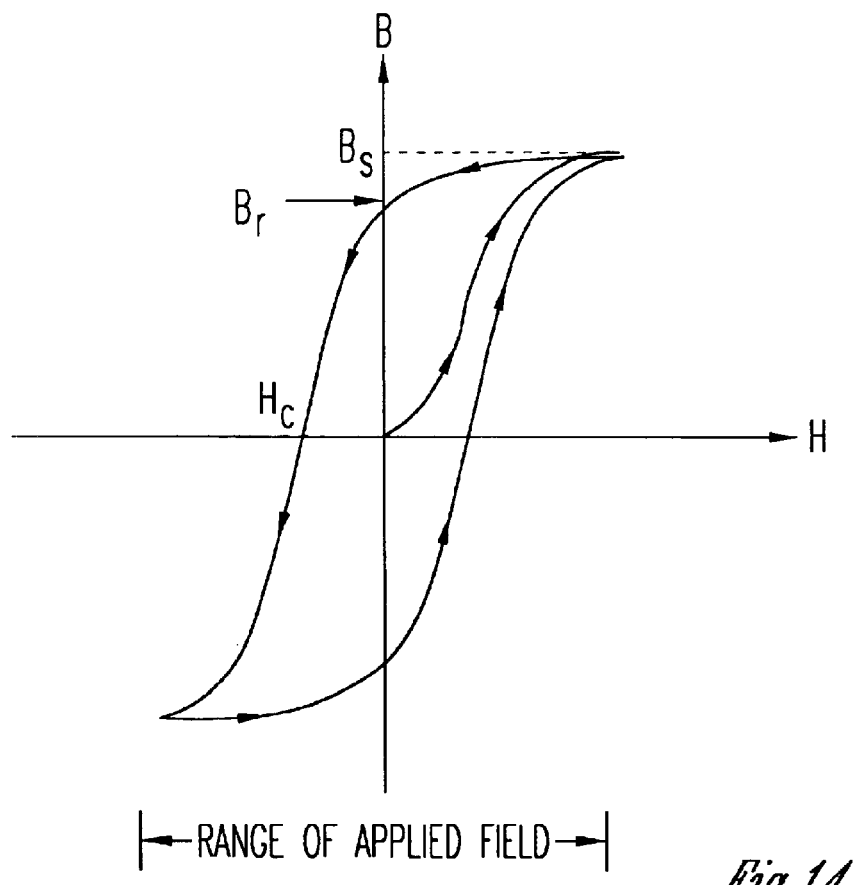
FIG. 14 illustrates a B-H hysteresis loop, including the remanence induction, for a ferromagnetic material.

FIG. 14 illustrates a B-H hysteresis loop, including the remanent magnetic flux density, for a ferromagnetic material. For ferromagnetic materials, magnetic flux density increases dramatically with magnetic field strength. The arrows in FIG. 14 indicates the direction of the magnetic flux density B for the material as a function of magnetic field strength H. The magnitude of the magnetic flux density levels off at a saturation magnetic flux density, $B_s$, as the field strength H increases. Much of the magnetic flux density is retained upon removal of the H field. The remaining magnetic flux density is referred to a remanent magnetic flux density, $B_r$, as illustrated in FIG. 14 at a field strength H of 0 A/m. One definition of remanence is the magnetic flux density remaining in a magnetized substance that is no longer under external magnetic influence. The remanent magnetic flux density is removed by applying a reverse field. B is reduced to 0 T at a coercive field $H_c$. As will be developed below with respect to FIGS. 16 and 17, the shape of the hysteresis loop is explained at the magnetic domain level.

Figure 15:
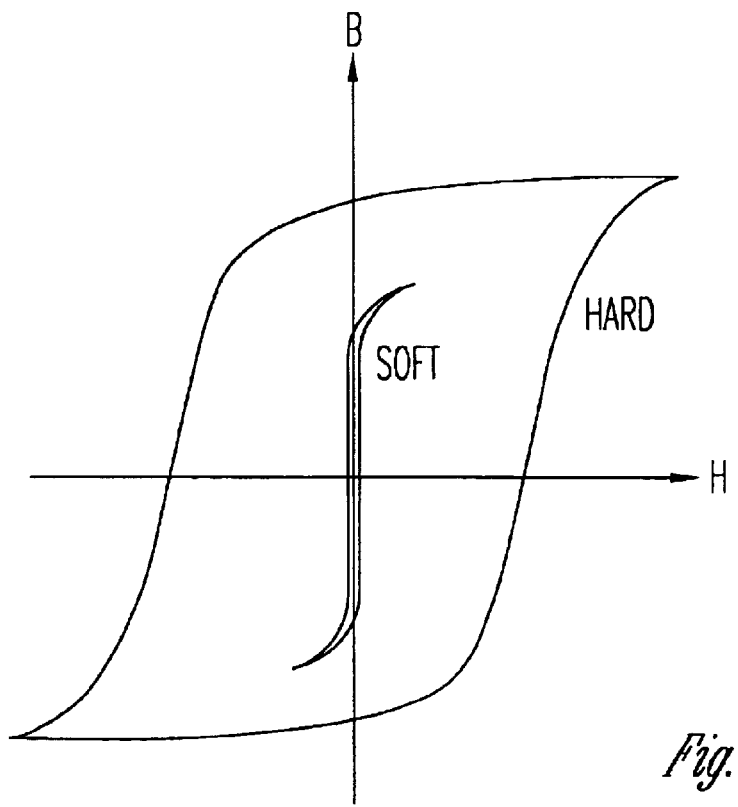
FIG. 15 illustrates B-H hysteresis loops for soft and hard ferromagnetic material.

FIG. 15 illustrates B-H hysteresis loops for soft and hard ferromagnetic material. A flux concentrator has previously been described as a material that has a high permeability and that is magnetically soft. Ferromagnetic materials with domain walls easily moved by applied fields are termed "soft" ferromagnetic materials. This is illustrated by the narrower hysteresis loop for the soft ferromagnetic material as compared to the hard ferromagnetic material. Although the hysteresis loop for soft ferromagnetic material is small compared to that for hard ferromagnetic material, a soft ferromagnetic material still shows non-negligible remanence. The illustrated hysteresis loops indicate that the magnetically soft flux concentrators have a remanent induction, $B_r$, similar to magnetically hard materials.

The figures described below illustrate a crystalline ferromagnetic structure as an example. One of ordinary skill in the art will understand, upon reading and comprehending this disclosure, that the present subject matter is not limited to crystalline structures as other structures such as polycrystalline structures can be used.

Figure 16:
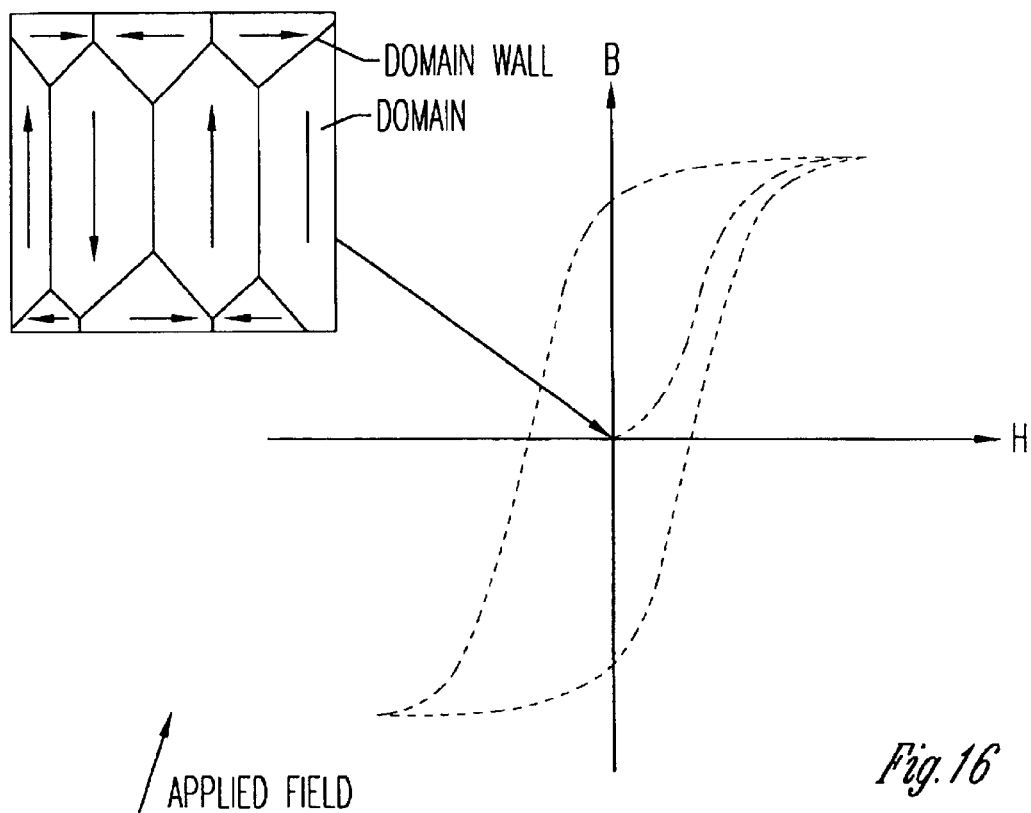
FIG. 16 illustrates a domain structure of an unmagnetized crystal in conjunction with the hysteresis loop for the crystal.

FIG. 16 illustrates a domain structure of an unmagnetized crystal (B=0) in conjunction with the hysteresis loop for the crystal. The microstructure is composed of magnetic domains. The orientation of magnetic moments of the domains is different such that the net effect is zero induction.

Figure 17:
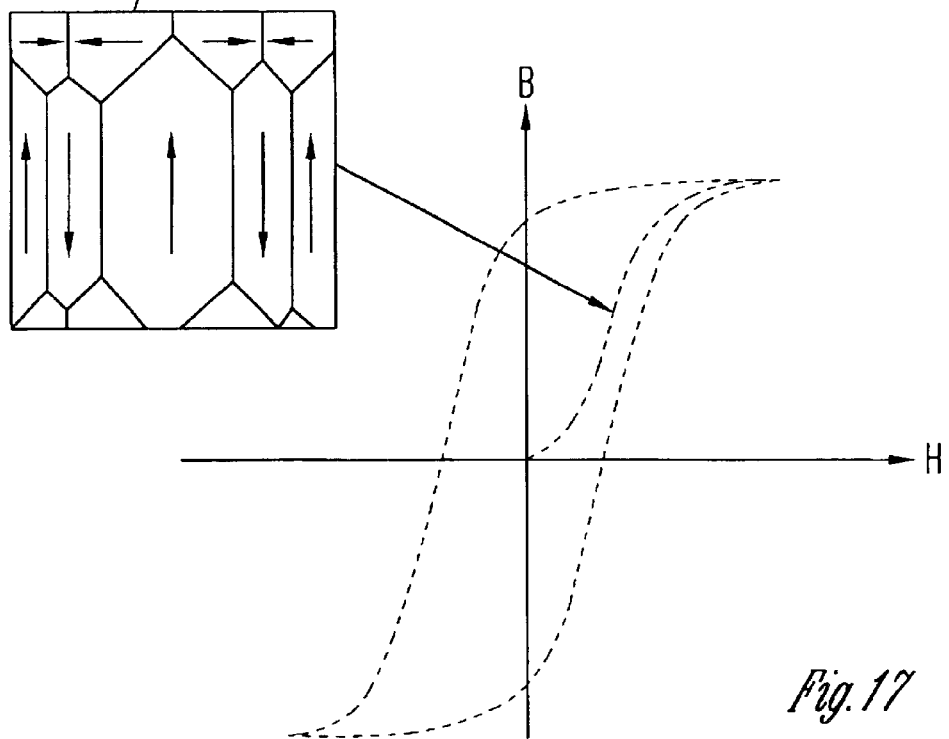
FIG. 17 illustrates a domain structure of a crystal during initial magnetization in conjunction with the hysteresis loop for the crystal.

FIG. 17 illustrates a domain structure of a crystal during initial magnetization in conjunction with the hysteresis loop for the crystal. A large fraction of the individual, atomic moments orientated parallel with respect to an applied field H cause a dramatic rise in the induction. Those domains with atomic moments parallel to the applied field H grow at the expense of those domains that have atomic moments that are not parallel to the applied field H. The growth of domains through domain wall motion is illustrated below with respect to FIG. 20.

Figure 18:
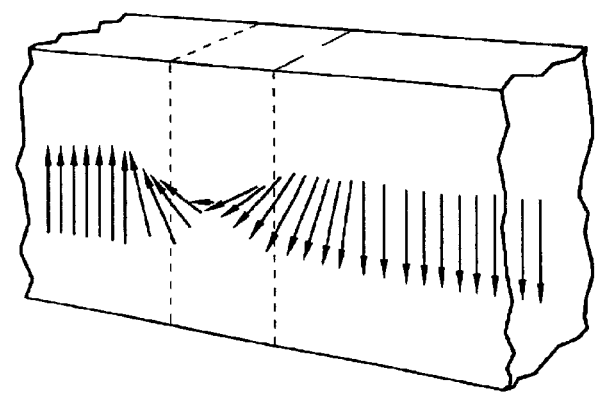
FIG. 18 illustrates domain wall motion through which atomic moments change orientation.

FIG. 18 illustrates domain wall motion through which atomic moments change orientation. A Bloch wall is illustrated. The Bloch wall is a narrow region in which the orientation of atomic moments changes systematically by 180°. The domain wall shifts to allow those domains whose atomic moments more closely align with the applied field H to grow.

Figure 19:
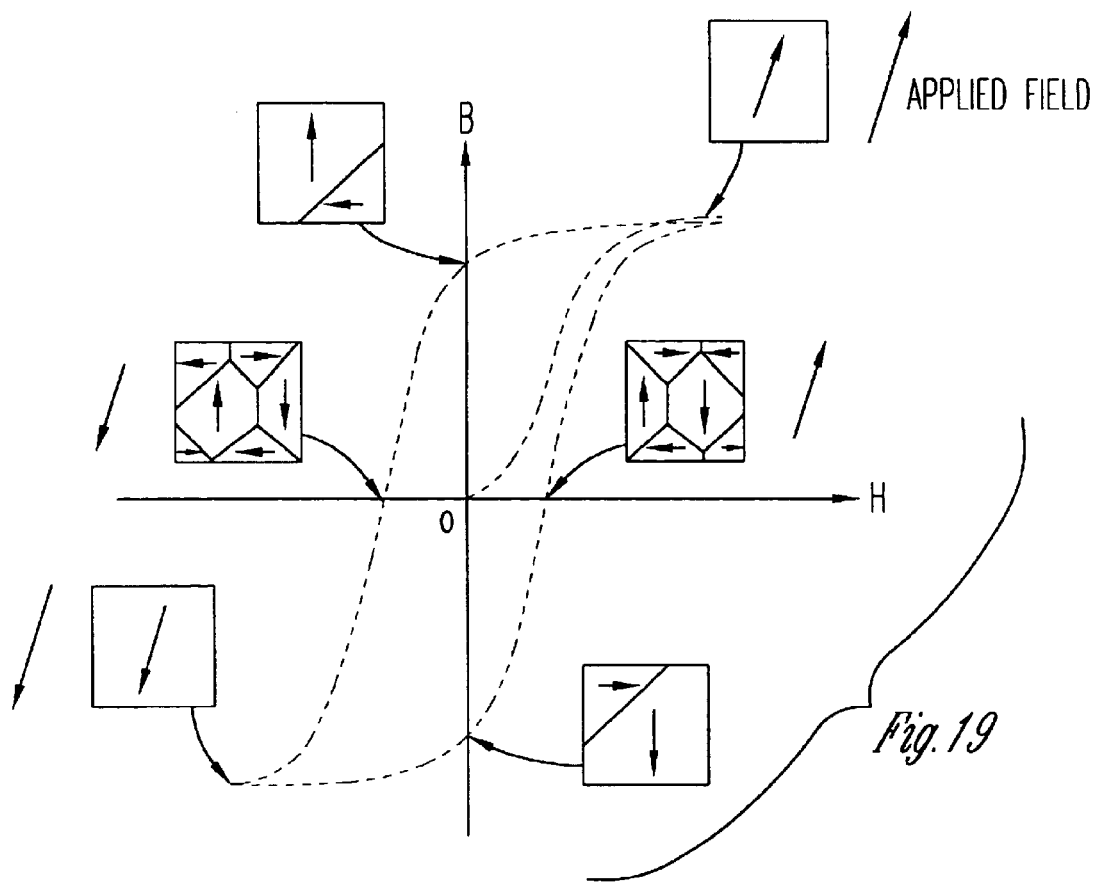
FIG. 19 illustrates the domain microstructures during the course of a ferromagnetic hysteresis loop.

FIG. 19 illustrates the domain microstructures during the course of a ferromagnetic hysteresis loop. The domain walls move according to the applied field. It is noted that the atomic moments align with the applied field H when the material reaches saturation induction ($B_s$, and $-B_s$). That is, the change in the magnetization occurs by rotation rather than domain wall motion.

Remanence Biasing Effect

Although flux concentrators minimize the current required to set the magnetization of the memory element, they are capable of having a non-zero remanence. Thus, flux concentrators are capable of magnetically biasing the magnetic elements in the MRAM. The magnetic biasing effect of the remanence is capable of significantly changing the amount of current required to write to the bit because the magnetic field attributable to the remanence is summed to the current-induced magnetic field.

Figure 20:
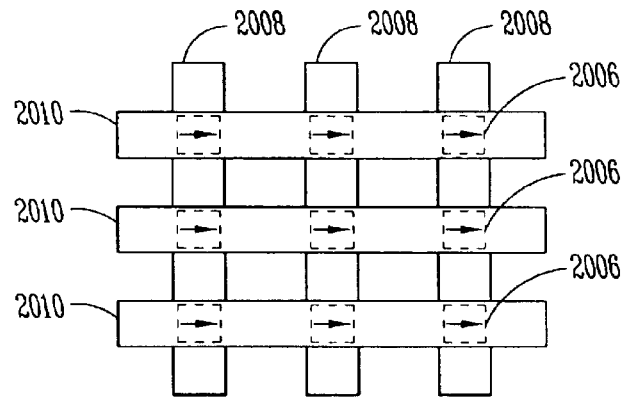
FIG. 20 is a top view of a conventional cross point array, and illustrates the magnetic moment of the magnetic storage elements in the array.
Figure 21:
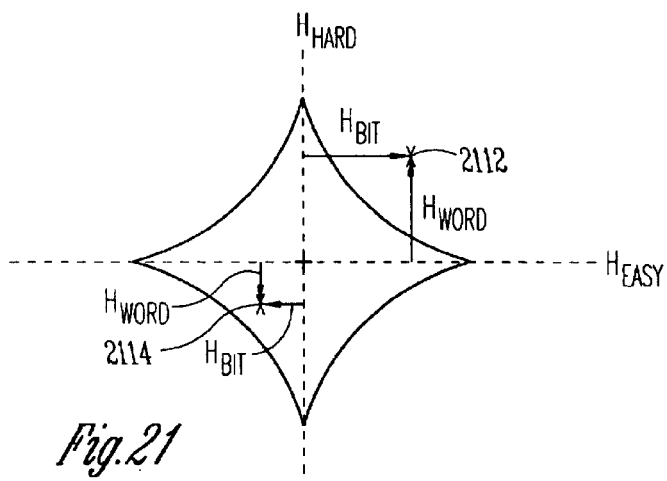
FIG. 21 is an astroid model of the magnetic response for magnetic storage elements.

FIGS. 20–21, described below, represent MRAM operation without taking into consideration the biasing effect of remanence. FIGS. 22–30, also described below, represent the effects of remanence with respect to MRAM operation.

FIG. 20 is a top view of a conventional cross point array, and illustrates the magnetic moment of the magnetic storage elements in the array. No current is flowing through any of the bit line conductors 2008 or the word line conductors 2010, and so no external magnetic field exists. The magnetic moment of each of the magnetic storage elements 2006 is in one of the stable states along the easy axis of magnetization. The easy axis of magnetization is illustrated to be aligned with the word line conductors 2210, but is not required to be so aligned.

FIG. 21 is an astroid model of the magnetic response for magnetic storage elements. The astroid model reflects switching when magnetic storage elements, or bits, are written. The switching threshold depends on the combination of easy axis and hard axis magnetic fields caused by the write currents in the bit line and word line conductors. A magnetic storage element is written when the combination of the easy axis, represented in the figure as $H_{EASY}$, and the hard axis, represented in the figure as $H_{HARD}$, magnetic fields results in a vector outside of the astroid as illustrated by the operating point 2112, and is not written when the combination of the easy axis and the hard axis magnetic fields results in a vector inside of the astroid as illustrated by operating point 2114. One of ordinary skill in the art will understand, upon reading and comprehending this disclosure, that these operating point locations 2112 and 2114 are provided as examples to illustrate the astroid model and should not be read to limit the present subject matter. In a conventional cross point array, only the selected cell should have a resultant vector outside of the astroid as both the bit line and word line are conducting current. The neighboring cells that have only one line conducting current should have a resultant vector inside of the astroid, and as such should not switch between the bistable states of the cell which lie in the direction of $H_{EASY}$.

Figure 22:
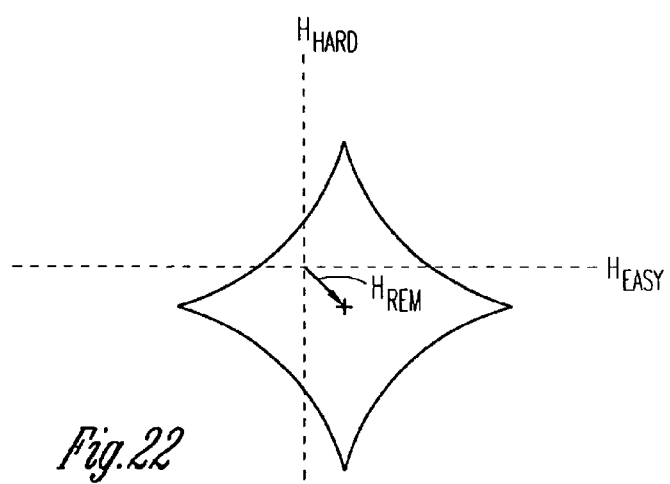
FIG. 22 is an astroid model of the magnetic response for magnetic storage elements illustrating the effect of remanence.

FIG. 22 is an astroid model of the magnetic response for magnetic storage elements illustrating the effect of remanence. The effect of remanence on the astroid is to shift the position of the astroid by the vector $H_{REM}$, wherein $H_{REM}$ is dependent on the vectors associated with the remanence attributed to the bit line magnetic flux and the word line magnetic flux as follows:

$$H_{REM} = \frac{B_{BIT}^{REM} + B_{WORD}^{REM}}{\mu_0}.$$

Figure 29:
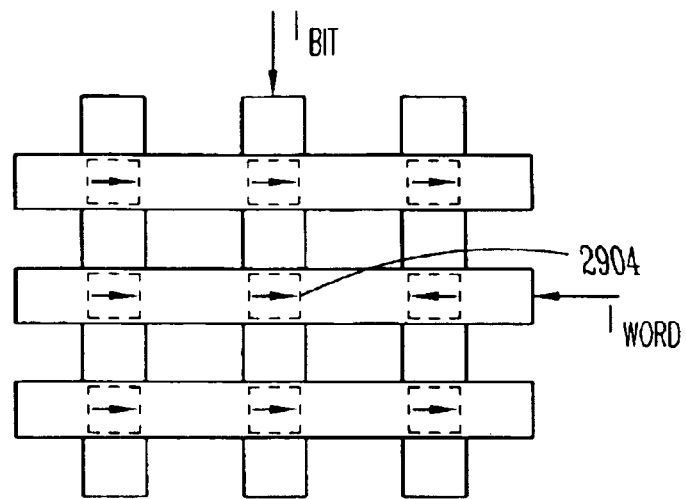
FIG. 29 is a top view of a conventional cross point array, and illustrates a write inhibit problem for a selected magnetic storage element.
Figure 30:
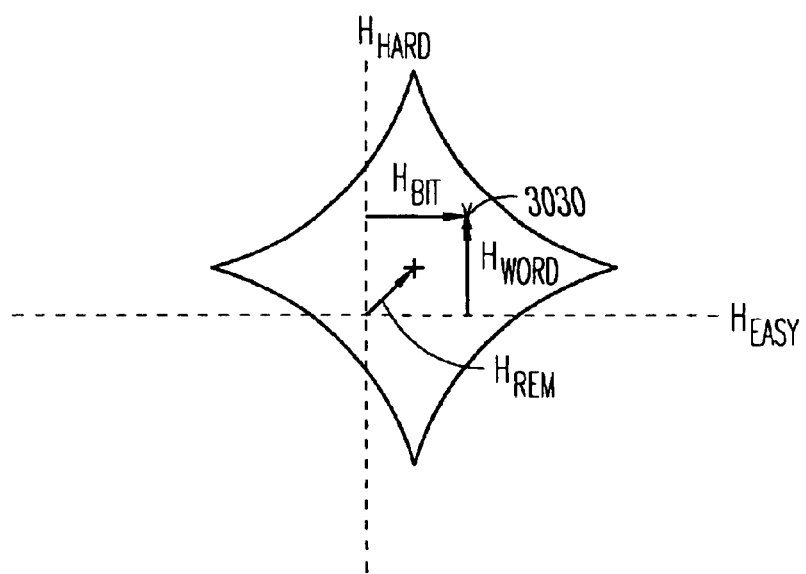
FIG. 30 is an astroid model for the write inhibit problem in the selected magnetic storage element illustrated in FIG. 29.

Since the position of the astroid is shifted, the fields required to write the bit are also shifted, which can cause problems as described below. FIGS. 23–28, described below, use the shifted astroid to illustrate a half select problem associated with remanence. FIGS. 29–30, described below, use the shifted astroid to illustrate a write inhibit problem associated with remanence.

Half Selection Problem

Figure 23:
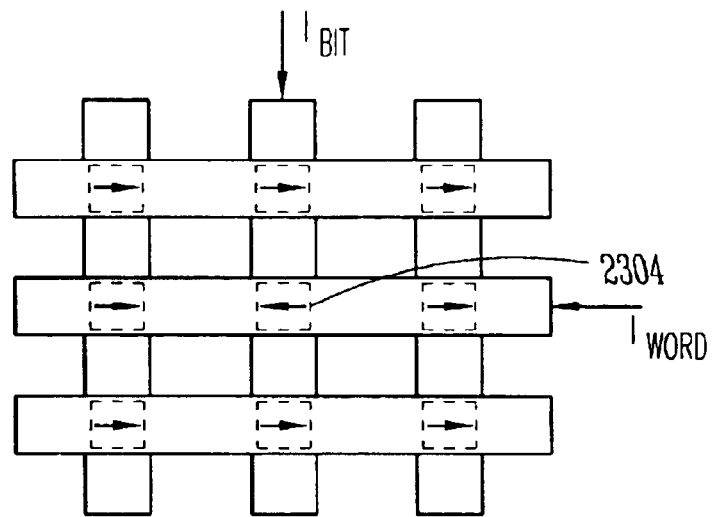
FIG. 23 is a top view of a conventional cross point array, and illustrates the writing of a selected magnetic storage element using a bit line current and a word line current.

FIG. 23 is a top view of a conventional cross point array, and illustrates the writing of a selected magnetic storage element, or bit, using a bit line current and a word line current. An $I_{BIT}$ current and an $I_{WORD}$ current are provided to write a selected bit 2304 in the cross point array. Preferably, only the selected bit 2304 has a resultant magnetic field vector sufficiently large to switch the magnetization of the bit.

Figure 24:
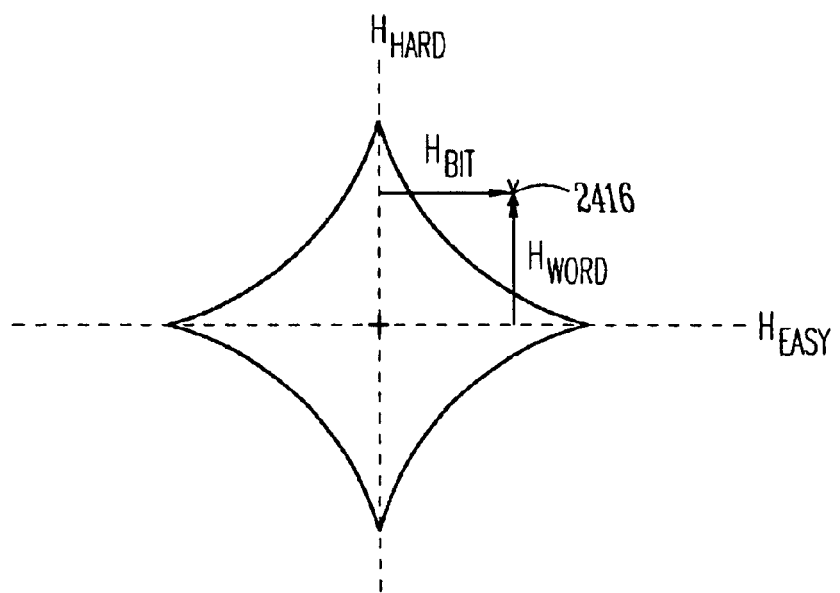
FIG. 24 is an astroid model for the selected bit in FIG. 23, illustrating that the operating point is outside of the astroid.

FIG. 24 is an astroid model for the selected bit in FIG. 23, illustrating that the operating point 2416 is outside of the astroid. The vectors $H_{WORD}$ and $H_{BIT}$ are summed to provide the resultant vector from the origin of the $H_{HARD}$ and $H_{EASY}$ axes. The vector $H_{WORD}$ is induced by the current $I_{WORD}$ and the vector $H_{BIT}$ is induced by the current $I_{BIT}$.

Figure 25:
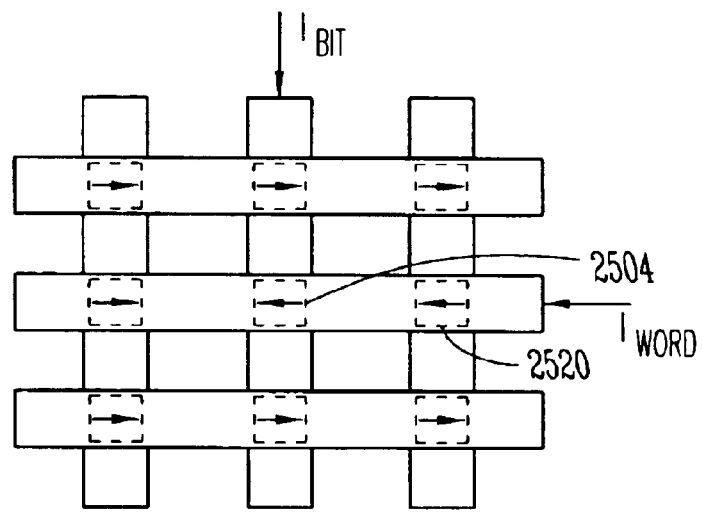
FIG. 25 is a top view of a conventional cross point array, and illustrates a half-select error in a non-selected magnetic storage element caused by a word line current.

FIG. 25 is a top view of a conventional cross point array, and illustrates a half-select error in a non-selected magnetic storage element caused by a word line current. An $I_{BIT}$ current and an $I_{WORD}$ current are provided to write a selected bit 2504 in the cross point array. In this example, however, the magnetization of a bit 2520 that was not selected has been unintentionally reoriented due to the $I_{WORD}$ current alone. This unintentional write to bit 2520, for example, is referred to as a half-select error.

Figure 26:
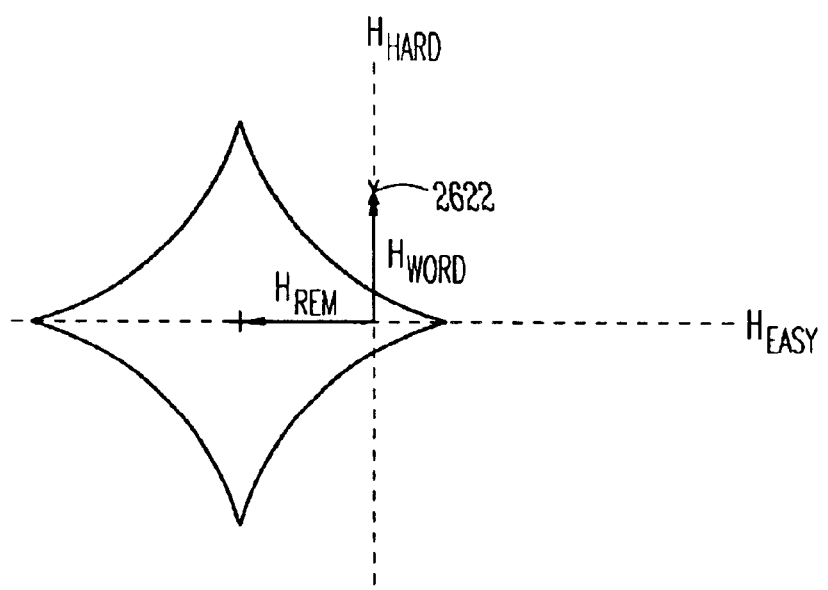
FIG. 26 is an astroid model for the half-select error in the non-selected magnetic storage element illustrated in FIG. 25.

FIG. 26 is an astroid model for the half-select error in the non-selected magnetic storage element 2520 illustrated in FIG. 25. The astroid has been shifted left because of the magnetic field attributable to remanence ($H_{REM}$) One of ordinary skill in the art will understand, upon reading and comprehending this disclosure, that the illustrated $H_{REM}$ is an example to show a half-select error. The origin of the $H_{HARD}$ and $H_{EASY}$ axes is positioned in the right portion of the astroid. As illustrated in this figure, the single vector $H_{WORD}$, which is induced by the current $I_{WORD}$, is sufficient to provide the operating point 2622 outside of the astroid.

Figure 27:
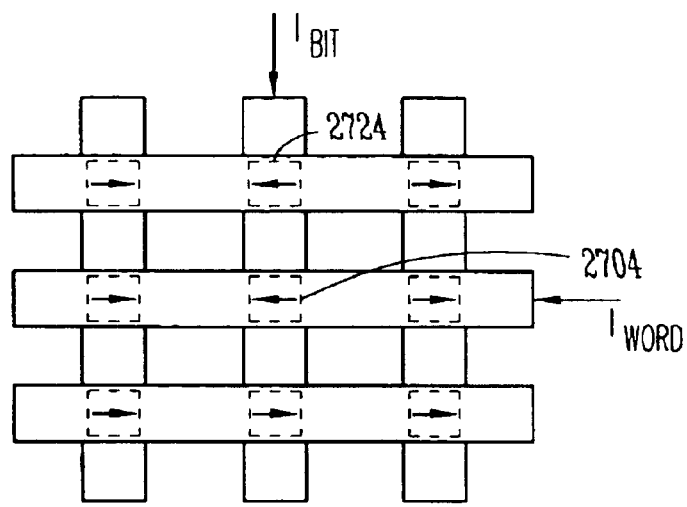
FIG. 27 is a top view of a conventional cross point array, and illustrates a half-select error in a non-selected magnetic storage element caused by a bit line current.

FIG. 27 is a top view of a conventional cross point array, and illustrates a half-select error in a non-selected magnetic storage element caused by a bit line current. An $I_{BIT}$ current and an $I_{WORD}$ current are provided to write a selected bit 2704 in the cross point array. In this example, however, the magnetization of a bit 2724 that was not selected has been unintentionally reoriented due to the $I_{BIT}$ current alone. Again, this unintentional write to bit 2724, for example, is referred to as a half-select error.

Figure 28:
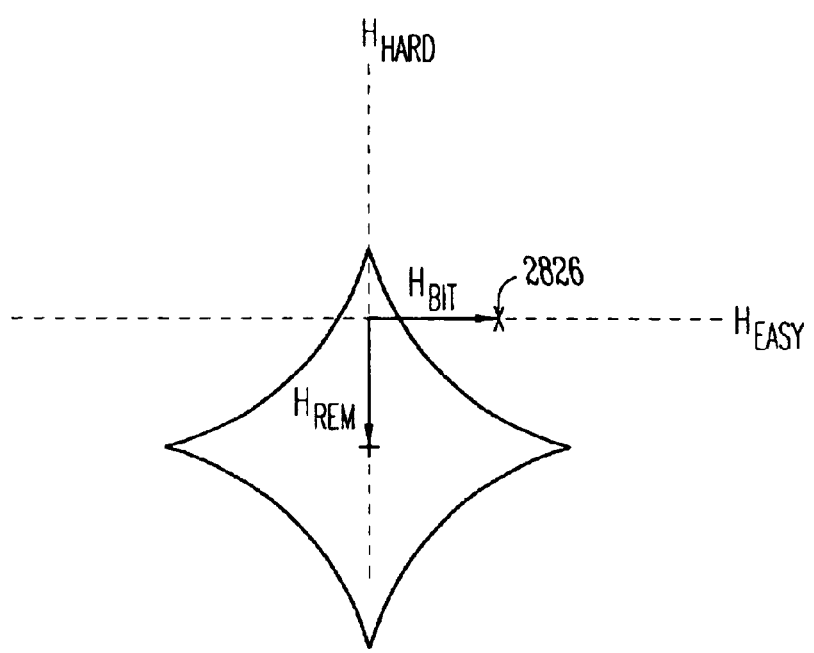
FIG. 28 is an astroid model for the half-select error in the non-selected magnetic storage element illustrated in FIG. 27.

FIG. 28 is an astroid model for the half-select error in the non-selected magnetic storage element 2724 illustrated in FIG. 27. The astroid has been shifted down because of the magnetic field attributable to remanence($H_{REM}$). The origin of the $H_{HARD}$ and $H_{EASY}$ axes is positioned in the upper portion of the astroid. As illustrated in this figure, the single vector $H_{BIT}$, which is induced by current $I_{BIT}$, is sufficient to provide the operating point 2826 outside of the astroid.

Write Inhibit Problem

FIG. 29 is a top view of a conventional cross point array, and illustrates a write inhibit problem for a selected magnetic storage element. An $I_{BIT}$ current and an $I_{WORD}$ current are provided to write a selected bit 2904 in the cross point array. However, in this example, the vector sum of the magnetic fields associated with the $I_{BIT}$ current and the $I_{WORD}$ current is not sufficient to reorient the magnetization of the selected bit 2904. This failed write attempt to a bit is referred to as a write inhibit problem.

FIG. 30 is an astroid model for the write inhibit problem in the selected magnetic storage element illustrated in FIG. 29. The astroid has been shifted up and right because of the magnetic field attributable to remanence ($H_{REM}$). The origin of the $H_{HARD}$ and $H_{EASY}$ axes is positioned in the lower left portion of the astroid. The vectors $H_{WORD}$ and $H_{BIT}$ are summed to provide the resultant vector from the origin of the $H_{HARD}$ and $H_{EASY}$ axes. As illustrated in this figure, the vector sum of $H_{WORD}$ and $H_{BIT}$ provides an operating point 3030 that lies within the astroid.

Flux Concentrator With Anisotropy

Figure 31:
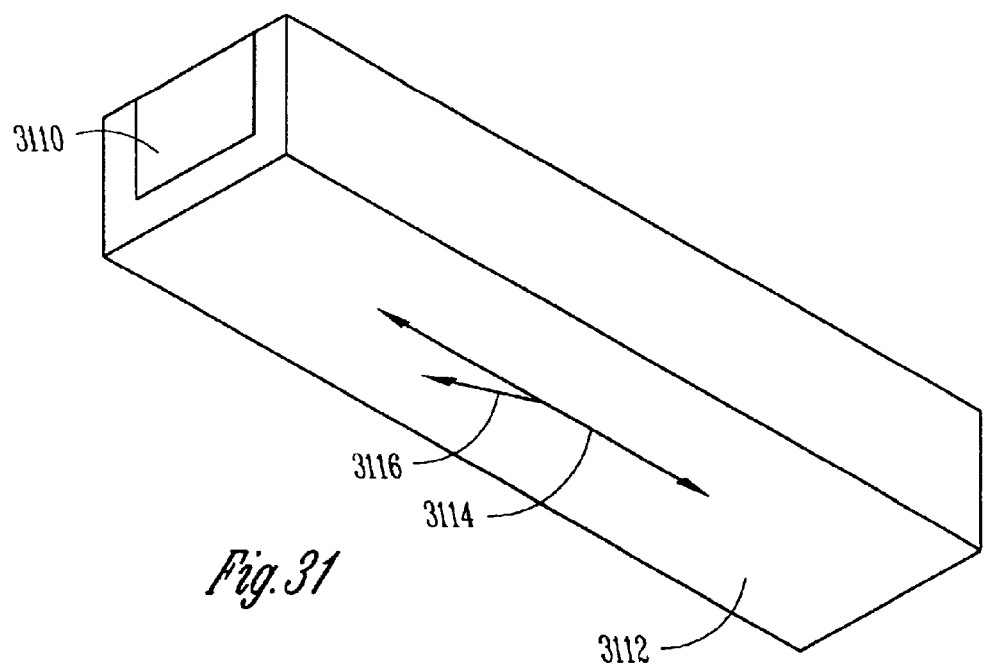
FIG. 31 illustrates a conductor and a flux concentrator with a large anisotropy so as to provide the flux concentrator with an easy axis aligned with current flow directions in the conductor.

FIG. 31 illustrates a conductor and a flux concentrator with a large anisotropy so as to provide the flux concentrator with an easy axis aligned with current flow directions in the conductor. The figure illustrates one conductor 3110 with associated cladding material 3112. One of ordinary skill in the art will understand, upon reading and comprehending this disclosure, how to incorporate large anistropy into other types of flux concentrators.

The large anistropy produces an easy axis of magnetization 3114 that is aligned with the conductor. In effect, the flux concentrator has a saturated magnetization. Current flow in the conductor produces a magnetic field orthogonal to the easy axis of magnetization (i.e. produces a magnetic field along the hard axis of magnetization). Because of the effectively saturated magnetization in the flux concentrator caused by the large anistropy, when the flux concentrator is under a current-induced field, the resulting magnetic moments 3116 in the flux concentrator changes through rotation rather than through domain wall motion. When the current-induced field is removed from the flux concentrator, the large anistropy rotates the magnetic moments back to being aligned with the conductor. As such, each flux concentrator does not retain an orthogonal remanent magnetic flux density (i.e. remanence).

In one embodiment, anisotropy is created in the flux concentrator using a material that is capable of being annealed in a magnetic field in order to produce a magnetic anisotropy parallel to the direction of the applied field. In one embodiment, the flux concentrator includes NiCoFe. According to various embodiments, the flux concentrator includes, but is not limited to, an alloy of Cobalt, an alloy of Iron, and an alloy of Nickel. According to various embodiments, these alloys can include additions of Copper and/or Molybdenum. According to various embodiments, the flux concentrator includes, but is not limited to, various combinations of an alloy of Cobalt, an alloy of Iron, and an alloy of Nickel. According to various embodiments, these combinations can include additions of Copper and/or Molybdenum. The magnitude of the resulting anistropic field is expected to be on the order of 10 Oe.

In one embodiment, a larger anistropic field is capable of being created in the flux concentrator by including a field pinning structure effectively near the flux concentrator. The magnitude of the resulting anistropic field is expected to be on the order of 100 Oe. One such embodiment is described below with respect to FIG. 32, and another such embodiment is described below with respect to FIG. 33.

Figure 32:
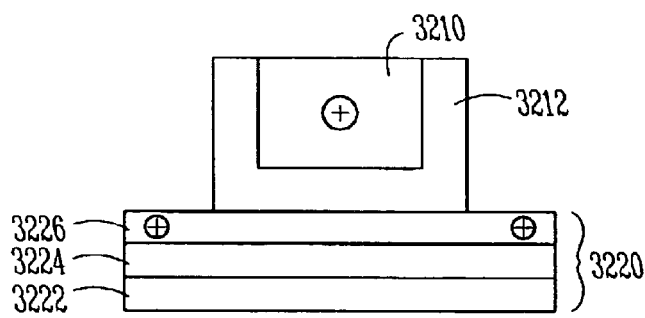
FIG. 32 illustrates one embodiment of a conductor, a flux concentrator, and a magnetic pinning structure adapted to provide a large anisotropic effect in the flux concentrator.

FIG. 32 illustrates one embodiment of a conductor 3210, a flux concentrator 3212, and a magnetic pinning structure 3220 adapted to provide a large anisotropic effect in the flux concentrator. A Ferromagnet, AntiFerromagnet, and Ferromagnet (FM/AFM/FM) pinning structure 3220 is formed effectively near the flux concentrator 3212. FIG. 32 illustrates one embodiment in which the FM/AFM/FM pinning structure is positioned below a word line with cladding. One of ordinary skill in the art will understand, upon reading and comprehending this disclosure, how to form pinning structures for cladding on bit lines and how to form pinning structures for other types of flux concentrators. In this embodiment, the FM/AFM/FM pinning structure is formed on a substrate. A trench for a ferromagnetically cladded conductor, such as a copper conductor, is formed over the pinning structure. As one of ordinary skill in the art will understand, upon reading and comprehending this disclosure, the FM/AFM/FM pinning structure is capable of producing a pinning field that is aligned with the conductor. The strength of the anisotropy created with the FM/AFM/FM sandwich is capable of being controlled by adjusting the FM thickness and/or the AFM thickness. The strength of the anisotropy created with the FM/AFM/FM sandwich also is capable of being controlled through material selection.

According to various embodiments, the FM layer includes, but is not limited to, an alloy of Cobalt, an alloy of Iron, and an alloy of Nickel. According to various embodiments, these alloys can include additions of Copper and/or Molybdenum. According to various embodiments, the FM layer includes, but is not limited to, various combinations of an alloy of Cobalt, an alloy of Iron, and an alloy of Nickel. According to various embodiments, these combinations can include additions of Copper and/or Molybdenum. According to various embodiments, the AFM layer includes, but is not limited to, NiMn, FeMn, IrMn, or PtMn.

The first FM layer 3222 functions as a seeding layer for the AFM layer 3224 so that the AFM layer is oriented as desired. The second FM layer 3226 is formed on the AFM layer. The FM layer functions as a pinning field layer because of the orientation of the AFM layer. The pinning field functions like a large anisotropy in the cladding if there is a good magnetic contact between the cladding material and the FM/AFM/FM sandwich. It is noted that the interface between the cladding and the top FM layer need not be as clean or smooth as that of a tunnel barrier interface. As such, it FM/AFM/FM sandwich is capable of being used as an etch stop layer while forming a trench for a damascene copper line, for example. According to various embodiments, the FM layer includes, but is not limited to, alloys of Ni, Fe or Co, or various combinations thereof. According to various embodiments, the AFM layer includes, but is not limited to, NiMn, FeMn, IrMn and/or PtMn.

Figure 33:
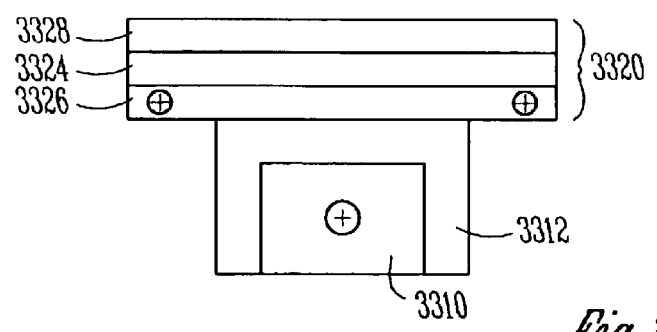
FIG. 33 illustrates another embodiment of a conductor, a flux concentrator, and a magnetic pinning structure adapted to provide a large anisotropic effect in the flux concentrator.

FIG. 33 illustrates another embodiment of a conductor 3310, a flux concentrator 3312, and a magnetic pinning structure 3320 adapted to provide a large anisotropic effect in the flux concentrator. The pinning structure is formed effectively near the flux concentrator 3312. In the illustrated embodiment, the flux concentrator 3312 includes FM cladding material that surrounds a portion of the conductor 3310. In the illustrated embodiment, an FM layer, such as one of the FM layers identified above for example, is formed on the cladding material as shown. An AFM layer, such as one of the AFM layer identified above for example, is formed on the FM layer. A capping layer 3328 is formed on the AFM layer. Capping layer forms a protective barrier. According to various embodiments, the capping material includes, but is not limited to, Tantalum, Nickel and/or Iron.

Figure 34:
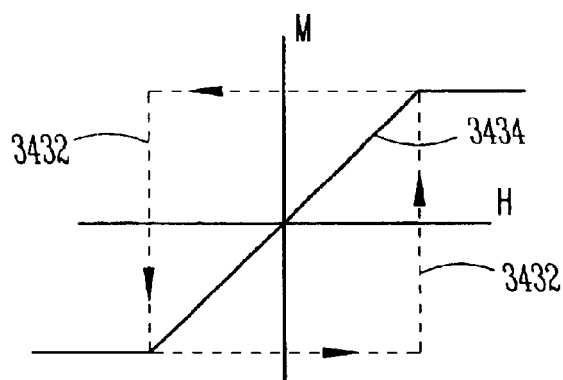
FIG. 34 illustrates an M-H plot for the easy-axis loop and the hard-axis loop for flux concentrator with large anisotropy shown in FIG. 33.

FIG. 34 illustrates a M-H plot for the easy-axis loop and the hard-axis loop for flux concentrator with large anisotropy, wherein M represents the magnetization within a material. The outside loop 3432 represents the magnetic field in the flux concentrator for the easy axis provided by the large anisotropy in the flux concentrator. The diagonal 3434 through the origin of the M and H plot represents the magnetic field for the hard axis in the flux concentrator. It is noted that, when the value of the field H is zero, the magnetic field in the flux concentrator for the hard axis is zero. As such, the present invention removes remanence in the flux concentrator with respect to the hard axis direction. Lower remanence reduces the offset fields produced by the flux concentrators, which improves the write margin for the magnetic memory elements.

MRAM Array Level

Figure 35:
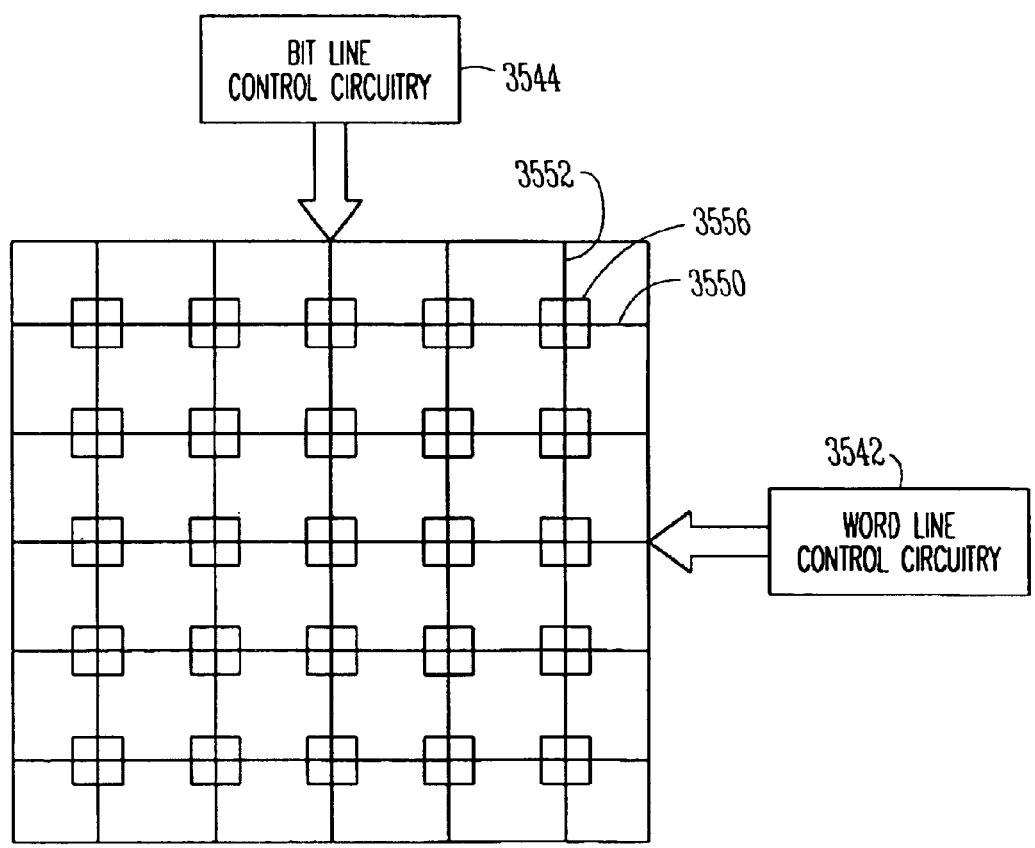
FIG. 35 illustrates a MRAM according to the present invention with magnetic memory cells or storage devices located at intersections among bit lines and word lines in a cross point array.

FIG. 35 illustrates a MRAM according to the present invention with magnetic memory cells or storage devices located at intersections among bit lines and word lines in a cross point array. The illustrated MRAM 3540 includes Word Line Control Circuitry 3542, and Bit Line Control Circuitry 3544. These control circuits control the current direction and magnitude on the conductors, and cooperate with each other to write to a desired magnetic storage device by providing the appropriate current to a word line conductor 3550 and a bit line conductor 3552 that corresponds to the desired magnetic storage device 3556. The magnetic storage device is capable of being magnetically coupled to a magnetic field generated by current in the word line and bit line conductors.

System Level

Figure 36:
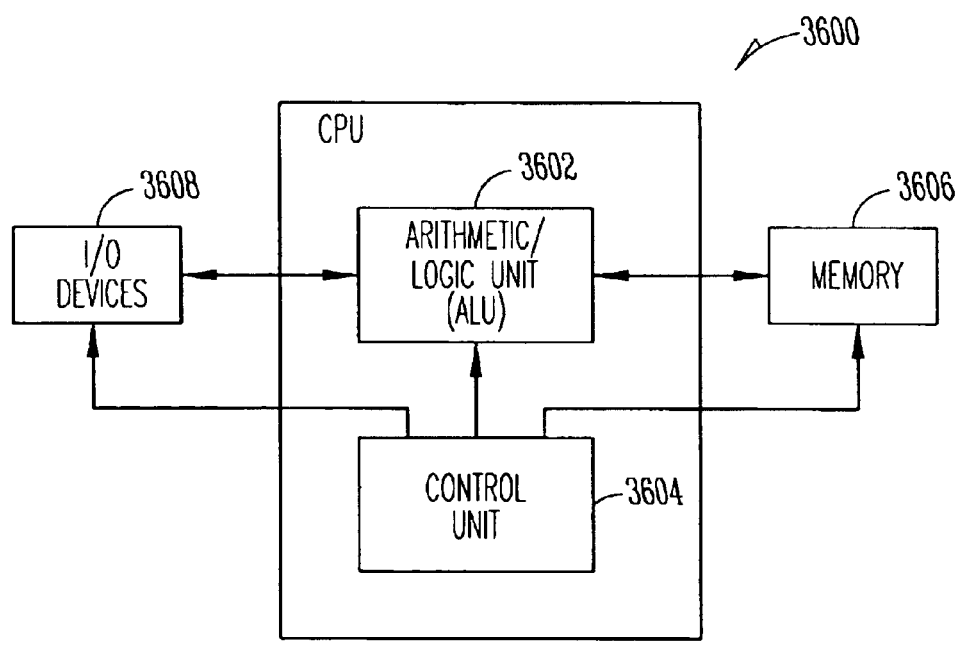
FIG. 36 is a simplified block diagram of a high-level organization of an electronic system according to the teachings of the present invention.

FIG. 36 is a simplified block diagram of a high-level organization of an electronic system according to the teachings of the present invention. The electronic system 3600 has functional elements, including a processor or arithmetic/logic unit (ALU) 3602, a control unit 3604, a memory device unit 3606 and an input/output (I/O) device 3608. Generally such an electronic system 3600 will have a native set of instructions that specify operations to be performed on data by the processor 3602 and other interactions between the processor 3602, the memory device unit 3606 and the I/O devices 3608. The control unit 3604 coordinates all operations of the processor 3602, the memory device 3606 and the I/O devices 3608 by continuously cycling through a set of operations that cause instructions to be fetched from the memory device 3606 and executed. Memory device can be implemented with MRAM and particularly the low remanence flux concentrator, according to the teachings of the present invention.

One of ordinary skill in the art will understand, upon reading and comprehending this disclosure, how to incorporate this MRAM technology into a variety of devices. These devices include giant magnetoresistance (GMR) devices, tunneling magnetoresistance (TMR) with magnetic tunnel junction (MTJ) devices, diode-isolated MTJ devices, transistor-isolated MTJ devices, and hall effect storage devices.

With respect to GMR technology, each memory cell is a "spin-valve" cell comprising two thin layers of ferromagnetic material separated by a thin layer of nonmagnetic metallic conducting material. The resistance of the sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

TMR uses magnetic tunnel junction (MTJ) devices. The MTJ device comprises two ferromagnetic layers separated by a thin, electrically insulating, tunnel barrier layer. The tunnel barrier layer is sufficiently thin that quantum-mechanical tunneling of charge carriers occurs between the ferromagnetic layers. The tunneling process is electron spin dependent which means that the tunneling current across the junction depends on the spin-dependent electronic properties of the ferromagnetic materials, and is a function of the relative orientation of the magnetic moments, or magnetization directions, of the two ferromagnetic layers. In the MTJ sensor, one ferromagnetic layer has its magnetic moment fixed or pinned, and the other ferromagnetic layer has its magnetic moment free to rotate in response to an external magnetic filed from the recording medium. When an electric potential is applied between the two ferromagnetic layers, the sensor resistance is a function of the tunneling current across the insulating layer between the ferromagnetic layers. Since the tunneling current that flows perpendicularly through the tunnel barrier layer depends on the relative magnetization directions of the two ferromagnetic layers, recorded data can be read from a magnetic medium because the signal field causes a change of direction of magnetization of the free layer, which in turn causes a change in resistance of the MTJ sensor, and a corresponding change in the sensed current or voltage.

A diode isolated MTJ device is a memory cell that includes a diode connected in series with an MTJ device. A transistor isolated MTJ device is a memory cell that includes a transistor connected in series with an MTJ. One reason for incorporating a diode or a transistor in series with an MTJ device is for read-select purposes; i.e. current is passed only through the selected MTJ.

A hall effect storage device is a memory device whose operation is based on the Hall effect. When a magnetic field is applied to a conductor carrying current, in a direction at right angles to the current, and electromotive force is produced across the conductor in a direction perpendicular to both the current and to the magnetic field. A hall effect storage device includes magnetic patch which stores data in the form of a magnetic field and a Hall-effect sensor for reading the stored data from the magnetic patch. Each sensor comprises a Hall bar and a detector means. As current is made to flow down the length of the Hall bar by an external means, a Hall voltage is developed across the Hall bar in a direction transverse to the direction of both the magnetic field and the current. The detector means is coupled to the Hall bar in such a way that it detects the Hall voltage, which itself is representative of the stored information. A magnetizing means is included for writing data or other information to each magnetic patch.

The figures presented and described in detail above are similarly useful in describing the method aspects of the present subject matter. The methods described below are nonexclusive as other methods may be understood from the specification and the figures described above.

One aspect provides a method of writing to a magnetic storage device. According to one embodiment, a first conductor is energized to provide a first current-induced magnetic flux through a first flux concentrator in a hard axis of magnetization direction. The first current-induced magnetic flux is provided to the magnetic storage device. A second conductor is energized to provide a second current-induced magnetic flux through a second flux concentrator in a hard axis of magnetization direction. The second current-induced magnetic flux is provided to the magnetic storage device. The combination of the first current-induced magnetic flux and the second current-induced magnetic flux is sufficient to move a magnetic moment of the magnetic storage device from a first stable state to a second stable state. When the current-induced magnetic fluxes are removed, the magnetization of the flux concentrators return to their easy axis of magnetization.

One aspect provides a method of forming a memory array. According to one embodiment, at least one first flux concentrator is formed with an easy axis of magnetization. At least one first conductor is formed to be operably positioned with respect to the first flux concentrator and aligned with the easy axis of magnetization. At least one magnetic memory element is formed to be operably positioned with respect to the first flux concentrator and the first conductor so as to receive a first current-induced magnetic flux. At least one second conductor is formed to be operably positioned with respect to the magnetic memory element so as to provide the magnetic memory element with a second current-induced magnetic flux from the second conductor. The second current-induced magnetic flux is relatively orthogonal to the first current-induced magnetic flux. At least one second flux concentrator is formed to be operably positioned with respect to the second conductor. The second flux concentrator is formed with an easy axis of magnetization aligned with the second conductor.

CONCLUSION

The present subject matter provides magnetic memory elements with low remanence flux concentrators. Flux concentrators concentrate magnetic flux into a desired area, and minimize the current required to set the magnetization of the memory element. The flux concentrator is provided with a large anisotropy to provide the flux concentrator with an easy axis of magnetization that is generally aligned with the conductor and a hard axis of magnetization that is generally orthogonal to the easy axis of magnetization. A current-induced magnetic field for writing to the memory elements is orthogonal to the easy axis of magnetization in the flux concentrator, such that the resulting change in magnetization in the flux concentrator is by rotation rather than by domain wall motion. When the current-induced magnetic field is removed, the magnetization of the flux concentrator realigns with the easy axis of magnetization so as to reduce remanence that provides the memory element with a biasing magnetic field.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A memory cell, comprising:
    a magnetic memory element;
    a flux concentrator operably positioned proximate to a conductor to provide a current-induced magnetic flux to the magnetic memory element; and
    means for providing the flux concentrator with an easy axis of magnetization aligned with the conductor and with an effectively saturated magnetization such that magnetic moments in the flux concentrator change through rotation rather than through domain wall motion.

2. The memory cell of claim 1, wherein the means for providing the flux concentrator with an easy axis of magnetization aligned with the conductor and with an effectively saturated magnetization includes means for providing an anisotropic field on the order of 100 Oe in the flux concentrator.

3. The memory cell of claim 1, wherein the means for providing the flux concentrator with an easy axis of magnetization aligned with the conductor and with an effectively saturated magnetization includes a Ferromagnet, AntiFerromagnet, and Ferromagnet (FM/AFM/FM) pinning structure operably positioned proximate to the flux concentrator.

4. The memory cell of claim 1, wherein the magnetic memory element includes a giant magnetoresistance (GMR) device.

5. The memory cell of claim 1, wherein the magnetic memory element includes tunneling magnetoresistance (TMR) with magnetic tunnel junction (MTJ) devices.

6. The memory cell of claim 1, wherein the magnetic memory element includes diode-isolated magnetic tunnel junction (MTJ) devices.

7. The memory cell of claim 1, wherein the magnetic memory element includes transistor-isolated magnetic tunnel junction (MTJ) devices.

8. A memory cell, comprising:
    a magnetic memory element;
    a flux concentrator operably positioned proximate to a conductor to provide a current-induced magnetic flux to the magnetic memory element; and
    a Ferromagnet, AntiFerromagnet, and Ferromagnet (FM/AFM/FM) pinning structure operably positioned proximate to the flux concentrator to provide an anisotropic field in the flux concentrator with an easy axis of magnetization aligned with the conductor and with magnitude to cause magnetic moments in the flux concentrator change through rotation rather than through domain wall motion.

9. The memory cell of claim 8, wherein the pinning structure is adapted to provide an approximately 100 Oe anisotropic field in the flux concentrator.

10. The memory cell of claim 8, wherein each FM in the FM/AFM/FM pinning structure includes an alloy of Cobalt.

11. The memory cell of claim 10, wherein the alloy of Cobalt includes Copper.

12. The memory cell of claim 10, wherein the alloy of Cobalt includes Molybdenum.

13. The memory cell of claim 10, wherein the alloy of Cobalt includes Copper and Molybdenum.

14. The memory cell of claim 8, wherein each FM in the FM/AFM/FM pinning structure includes an alloy of Iron.

15. The memory cell of claim 14, wherein the alloy of Iron includes Copper.

16. The memory cell of claim 14, wherein the alloy of Iron includes Molybdenum.

17. The memory cell of claim 14, wherein the alloy of Iron includes Copper and Molybdenum.

18. The memory cell of claim 8, wherein each FM in the FM/AFM/FM pinning structure includes an alloy of Nickel.

19. The memory cell of claim 18, wherein the alloy of Nickel includes Copper.

20. The memory cell of claim 18, wherein the alloy of Nickel includes Molybdenum.

21. The memory cell of claim 18, wherein the alloy of Nickel includes Copper and Molybdenum.

22. The memory cell of claim 8, wherein at least one FM in the FM/AFM/FM pinning structure includes a combination of at least two alloys selected from the group of alloys consisting of a Cobalt alloy, an Iron alloy and a Nickel alloy.

23. The memory cell of claim 8, wherein the AFM in the FM/AFM/FM pinning structure includes NiMn.

24. The memory cell of claim 8, wherein the AFM in the FM/AFM/FM pinning structure includes FeMn.

25. The memory cell of claim 8, wherein the AFM in the FM/AFM/FM pinning structure includes IrMn.

26. The memory cell of claim 8, wherein the AFM in the FM/AFM/FM pinning structure includes PtMn.

27. A memory system, comprising:
    a plurality of parallel bit line conductors aligned in a first direction in a first plane and a plurality of parallel word line conductors aligned in a second direction in a second plane, the first and second directions being orthogonal;
    a plurality of magnetic memory elements, each memory element being operably positioned between and at a cross point of one of the bit line conductors and one of the word line conductors;
    a word line control circuit connected to the word line conductors and a bit line control circuit connected to the bit line conductors, the word line and bit line control circuits being adapted to cooperate to energize a selected one of the word lines and a selected one of the bit lines to cause a current-induced magnetic field to write data to a selected one of the memory storage elements; and
    each of the bit line conductors and the word line conductors including a flux concentrator, the flux concentrator including an anisotropic field with an easy axis of magnetization aligned with a corresponding conductor and with a magnitude to cause magnetic moments in the flux concentrator to change through rotation rather than through domain wall motion.

28. The memory system of claim 27, wherein each of the bit line conductors and the word line conductors include a pinning structure to provide the flux concentrator with the anisotropic field.

29. The memory system of claim 27, wherein the pinning structure includes a Ferromagnet, AntiFerromagnet, and Ferromagnet (FM/AFM/FM) pinning structure.

30. The memory system of claim 27, wherein the anisotropic field in the flux concentrator is on the order of 100 Oe.

31. A memory system, comprising:
a plurality of parallel bit line conductors aligned in a first direction in a first plane and a plurality of parallel word line conductors aligned in a second direction in a second plane, the first and second directions being orthogonal;
a plurality of magnetic memory elements, each memory element being operably positioned between and at a cross point of one of the bit line conductors and one of the word line conductors;
a word line control circuit connected to the word line conductors and a bit line control circuit connected to the bit line conductors, the word line and bit line control circuits being adapted to cooperate to energize a selected one of the word lines and a selected one of the bit lines to cause a current-induced magnetic field to write data to a selected one of the memory storage elements; and
each of the bit line conductors and the word line conductors including a flux concentrator, and a Ferromagnet, AntiFerromagnet, and Ferromagnet (FM/AFM/FM) pinning structure to provide the flux concentrator with an anisotropic field having an easy axis of magnetization aligned with a corresponding conductor and having a magnitude on the order of 100 Oe to cause magnetic moments in the flux concentrator to change through rotation rather than through domain wall motion.

32. The memory system of claim 31, wherein:
each FM in the FM/AFM/FM pinning structure includes one or more alloys selected from a group of alloys consisting of: a Cobalt alloy, an Iron alloy and a Nickel alloy.

33. The memory system of claim 31, wherein each FM in the FM/AFM/FM pinning structure further includes at least one of Copper and Molybdenum.

34. The memory system of claim 31, wherein the AFM in the FM/AFM/FM pinning structure includes NiMn.

35. The memory system of claim 31, wherein the AFM in the FM/AFM/FM pinning structure includes FeMn.

36. The memory system of claim 31, wherein the AFM in the FM/AFM/FM pinning structure includes IrMn.

37. The memory system of claim 31, wherein the AFM in the FM/AFM/FM pinning structure includes PtMn.

38. A method for writing to a magnetic storage device, comprising:
energizing a first conductor to provide a first current-induced magnetic field through a first flux concentrator in a hard axis of magnetization direction for the first flux concentrator, the first flux concentrator having an anisotropic field of sufficient magnitude such that the first current-induced magnetic field causes magnetic moments in the first flux concentrator to move from a first orientation to a second orientation through rotation rather than through domain wall motion; and
energizing a second conductor to provide a second current-induced magnetic field through a first flux concentrator in a hard axis of magnetization direction for the second flux concentrator, the second flux concentrator having an anisotropic field of sufficient magnitude such that the second current-induced magnetic field causes magnetic moments in the second flux concentrator to move from a third orientation to a fourth orientation through rotation rather than through domain wall motion.

39. The method of claim 38, further comprising:
de-energizing the first conductor, wherein the anisotropic field causes the magnetic moments to return from the second orientation to the first orientation through rotation; and
de-energizing the second conductor, wherein the anisotropic field causes the magnetic moments to return from the fourth orientation to the second orientation through rotation.

* * * * *

UNITED STATES PATENT AND TRADEMARK OFFICE
CERTIFICATE OF CORRECTION

PATENT NO. : 7,009,874 B2
APPLICATION NO. : 10/932949
DATED : March 7, 2006
INVENTOR(S) : Deak It is certified that error appears in the above-identified patent and that said Letters Patent is hereby corrected as shown below:

Title Page;

On the face page, in field (56), under "Other Publications", in column 2, line 2, delete "300°" and insert -- 300°C --, therefor.

On the face page, in field (56), under "Other Publications", in column 2, line 4, delete "F." and insert -- F., --, therefor.

On the face page, in field (56), under "Other Publications", in column 2, line 7, delete "magnetorsistance" and insert -- magnetoresistance --, therefor.

On the face page, in field (56), under "Other Publications", in column 2, line 8, delete "magnetics" and insert -- magnetic --, therefor.

On the face page, in field (56), under "Other Publications", in column 2, line 11, delete "magnetorsistance" and insert -- magnetoresistance --, therefor.

On the face page, in field (56), under "Other Publications", in column 2, line 15, delete "anneling" and insert -- annealing --, therefor.

On the face page, in field (56), under "Other Publications", in column 2, line 15, delete "Fe/FeOx/Al" and insert -- Fe/FeOx/Al --, therefor.

On the face page, in field (56), under "Other Publications", in column 2, line 15, delete "Co/CoOx/Al" and insert -- Co/CoOx/Al --, therefor.

On page 2, in field (56), under "U.S. Patent Documents", in column 1, line 29, after "6,326,637 B1" delete "*".

On page 2, in field (56), under "U.S. Patent Documents", in column 1, line 31, after "6,392,922 B1" delete "*".

On page 2, in field (56), under "U.S. Patent Documents", in column 1, line 37, after "6,570,783 B1" delete "*".

On page 2, in field (56), under "U.S. Patent Documents", in column 1, line 38, after "6,623,987 B1" delete "*".

On page 2, in field (56), under "U.S. Patent Documents", in column 1, line 39, after "6,627,932 B1", delete "*".

UNITED STATES PATENT AND TRADEMARK OFFICE
CERTIFICATE OF CORRECTION

PATENT NO.       : 7,009,874 B2
APPLICATION NO. : 10/932949
DATED            : March 7, 2006
INVENTOR(S)      : Deak It is certified that error appears in the above-identified patent and that said Letters Patent is hereby corrected as shown below:

On page 2, in field (56), under "U.S. Patent Documents", in column 1, line 40, after "6,656,371 B1" delete "*".

On page 2, in field (56), under "U.S. Patent Documents", in column 1, line 41, after "6,677,631 B1" delete "*".

On page 2, in field (56), under "U.S. Patent Documents", in column 1, line 42, after "6,683,806 B1" delete "*".

On page 2, in field (56), under "U.S. Patent Documents", in column 1, line 43, after "6,689,622 B1" delete "*".

On page 2, in field (56), under "U.S. Patent Documents", in column 1, line 44, after "6,707,084 B1" delete "*".

On page 2, in field (56), under "U.S. Patent Documents", in column 1, line 45, after "6,716,644 B1" delete "*".

On page 2, In field (56), under "U.S. Patent Documents", in column 1, line 46, after "6,724,652 B1" delete "*".

On page 2, in field (56), under "U.S. Patent Documents", in column 1, line 47, after "6,728,132 B1" delete "*".

On page 2, in field (56), under "U.S. Patent Documents", in column 1, line 49, after "6,743,641 B1" delete "*".

On page 2, in field (56), under "U.S. Patent Documents", in column 1, line 50, after "6,765,823 B1" delete "*".

On page 2. in field (56), under "U.S. Patent Documents", in column 1, line 51, after "6,771,533 B1" delete "*".

On page 2, in field (56), under "U.S. Patent Documents", in column 2, line 10, delete "2002/0007454 A1 1/2002" and insert -- 2002/0074541 A1 6/2002 --, therefor.

On page 2, in field (56), under "U.S. Patent Documents", in column 2, line 11, after "4/2002" delete "Qmano et al." and insert -- Amano et al. --, therefor.

UNITED STATES PATENT AND TRADEMARK OFFICE
CERTIFICATE OF CORRECTION

PATENT NO.         : 7,009,874 B2
APPLICATION NO. : 10/932949
DATED                 : March 7, 2006
INVENTOR(S)      : Deak It is certified that error appears in the above-identified patent and that said Letters Patent is hereby corrected as shown below:

On page 2, in field (56), under "U.S. Patent Documents", in column 2, line 31, after "1/2004" delete "Nejad" and insert -- Nejad et al. --, therefor.

On page 2, in field (56), under "U.S. Patent Documents", in column 2, line 50, after "2004/0119095 A1" delete "*".

On page 2, in field (56), under "U.S. Patent Documents", in column 2, line 51, after "2004/0124485 A1" delete "*".

On page 2, in field (56), under "U.S. Patent Documents", in column 2, line 52, after "2004/0145943 A1" delete "*".

On page 2, in field (56), under "U.S. Patent Documents", in column 2, line 53, after "2004/0150059 A1" delete "*".

On page 2, in field (56), under "U.S. Patent Documents", in column 2, line 54, after "2004/0152265 A1" delete "*".

On page 2, in field (56), under "U.S. Patent Documents", in column 2, line 55, delete "2004/0155218 A1 *" and insert -- 2004/0152218 A1--, therefor.

On page 2, in field (56), under "U.S. Patent Documents", in column 2, line 56, after "2004/0160810 A1" delete "*".

On page 2, in field (56), under "U.S. Patent Documents", in column 2, line 57, after "2004/0166618 A1" delete "*".

On page 2, in field (56), under "U.S. Patent Documents", in column 2, line 58, after "2004/0180237 A1" delete "*".

On page 2, in field (56), under "U.S. Patent Documents", in column 2, line 59, after "2004/0183099 A1" delete "*".

On page 2, in field (56), under "U.S. Patent Documents", in column 2, line 60, after "2004/0195639 A1" delete "*".

On page 2, in field (56), under "U.S. Patent Documents", in column 2, line 61, after "2004/0201070 A1" delete "*".

UNITED STATES PATENT AND TRADEMARK OFFICE
CERTIFICATE OF CORRECTION

| | |
|---|---|
| PATENT NO. | : 7,009,874 B2 |
| APPLICATION NO. | : 10/932949 |
| DATED | : March 7, 2006 |
| INVENTOR(S) | : Deak |

It is certified that error appears in the above-identified patent and that said Letters Patent is hereby corrected as shown below:

On page 2, in field (56), under "U.S. Patent Documents", in column 2, line 62, after "2004/0202018 A1" delete "*".

On page 2, in field (56), under "U.S. Patent Documents", in column 2, line 63, after "2004/0217399 A1" delete "*".

On page 2, in field (56), under "U.S. Patent Documents", in column 2, line 64, after "2004/0217403 A1" delete "*".

On page 2, in field (56), under "U.S. Patent Documents", in column 2, line 65, after "2004/0227244 A1" delete "*".

On page 2, in field (56), under "U.S. Patent Documents", in column 2, line 66, after "2004/0234815 A1" delete "*".

On page 2, in field (56), under "U.S. Patent Documents", in column 2, line 67, after "2004/0240264 A1" delete "*".

On page 2, in field (56), under "U.S. Patent Documents", in column 2, line 68, after "2005/0003561 A1" delete "*".

On page 2, in field (56), under "U.S. Patent Documents", in column 2, line 69, after "2005/0040453 A1" delete "*".

On page 3, in field (56), under "U.S. Patent Documents", in column 1, line 1, after "2005/0041463 A1" delete "*".

On page 3, in field (56), under "U.S. Patent Documents", in column 1, line 2, after "2005/0047263 A1" delete "*".

On page 3, in field (56), under "U.S. Patent Documents", in column 1, line 3, after "2005/0078512 A1" delete "*".

On page 3, in field (56), under "U.S. Patent Documents", in column 1, line 4, after "2005/0079638 A1" delete "*".

On page 3, in field (56), under "U.S. Patent Documents", in column 1, line 5, after "2005/0099844 A1" delete "*".

UNITED STATES PATENT AND TRADEMARK OFFICE
CERTIFICATE OF CORRECTION

PATENT NO. : 7,009,874 B2
APPLICATION NO. : 10/932949
DATED : March 7, 2006
INVENTOR(S) : Deak It is certified that error appears in the above-identified patent and that said Letters Patent is hereby corrected as shown below:

On page 3, in field (56), under "U.S. Patent Documents", in column 1, line 6, after "2005/0122773 A1" delete "*".

On page 3, in field (56), under "U.S. Patent Documents", in column 1, line 7, after "2005/0146912 A1" delete "*".

In column 7, line 47, delete "indicates" and insert -- indicate --, therefor.

In column 8, line 41, delete "$B_s$," and insert -- $B_s$ --, therefor.

In column 10, line 56, delete "anistropy" and insert -- anisotropy --, therefor.

In column 10, line 58, delete "anistropy" and insert -- anisotropy --, therefor.

In column 10, line 65, delete "anistropy" and insert -- anisotropy --, therefor.

In column 11, line 3, delete "anistropy" and insert -- anisotropy --, therefor.

In column 11, line 21, delete "anistropic" and insert -- anisotropic --, therefor.

In column 11, line 23, delete "anistropic" and insert -- anisotropic --, therefor.

In column 11, line 26, delete "anistropic" and insert -- anisotropic --, therefor.

In column 13, line 44, delete "filed" and insert -- field --, therefor.

Signed and Sealed this

Twenty-fourth Day of October, 2006

JON W. DUDAS
*Director of the United States Patent and Trademark Office*